(12) United States Patent  
Nomura

(10) Patent No.: US 7,988,057 B2
(45) Date of Patent: Aug. 2, 2011

(54) MEMORY DEVICE AND SEMICONDUCTOR DEVICE

(75) Inventor: Ryoji Nomura, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 946 days.

(21) Appl. No.: 11/976,788

(22) Filed: Oct. 29, 2007

(65) Prior Publication Data

US 2008/0121725 A1  May 29, 2008

(30) Foreign Application Priority Data

Nov. 28, 2006 (JP) ................................. 2006-320482

(51) Int. Cl.
*G06K 19/06* (2006.01)
(52) U.S. Cl. ...................................................... 235/492
(58) Field of Classification Search .............. 235/380, 235/492; 439/99; 257/4, E51.008
See application file for complete search history.

(56) References Cited

U.S. PATENT DOCUMENTS

| 5,853,905 | A | 12/1998 | So et al. |
| 6,950,331 | B2 | 9/2005 | Yang et al. |
| 6,965,195 | B2 | 11/2005 | Yamazaki et al. |
| 7,518,146 | B2* | 4/2009 | Yamazaki et al. .............. 257/72 |
| 2003/0183699 | A1 | 10/2003 | Masui |
| 2004/0027849 | A1 | 2/2004 | Yang et al. |
| 2004/0057323 | A1 | 3/2004 | Tanabe |
| 2004/0246768 | A1 | 12/2004 | Krieger et al. |
| 2006/0214008 | A1 | 9/2006 | Asami et al. |
| 2007/0051940 | A1 | 3/2007 | Clemens et al. |
| 2007/0153565 | A1 | 7/2007 | Nomura et al. |

FOREIGN PATENT DOCUMENTS

| JP | 09-208809 | 8/1997 |
| JP | 11-307261 | 11/1999 |
| JP | 2000-030870 | 1/2000 |
| JP | 2001-345431 | 12/2001 |
| JP | 2002-026277 | 1/2002 |
| JP | 2004-200569 | 7/2004 |
| JP | 2005-311336 | 11/2005 |
| JP | 2006-148080 | 6/2006 |
| WO | WO 2004/015778 | 2/2004 |
| WO | WO 2005/096380 | 10/2005 |
| WO | WO 2006/043611 | 4/2006 |
| WO | WO 2006/043687 | 4/2006 |
| WO | WO 2006/101241 | 9/2006 |

* cited by examiner

*Primary Examiner* — Seung H Lee
(74) *Attorney, Agent, or Firm* — Eric J. Robinson; Robinson Intellectual Property Law Office, P.C.

(57) ABSTRACT

It is an object to provide a flexible semiconductor device bearing a memory device with a highly reliable storage function, where the memory device comprises a layer containing an organic compound. Specifically, the memory device has a memory element which comprises a layer including an organic compound between a pair of electrodes and a sealing layer formed over the memory element, and a moisture absorbing material is contained in the sealing layer. As the moisture absorbing material, a particle of molten silica, crystalline silica, alumina, silicon nitride, aluminum nitride, boron nitride, zeolite, an oxide of an alkaline earth metal, sulfate or a high water-absorbing polymer can be used.

25 Claims, 17 Drawing Sheets

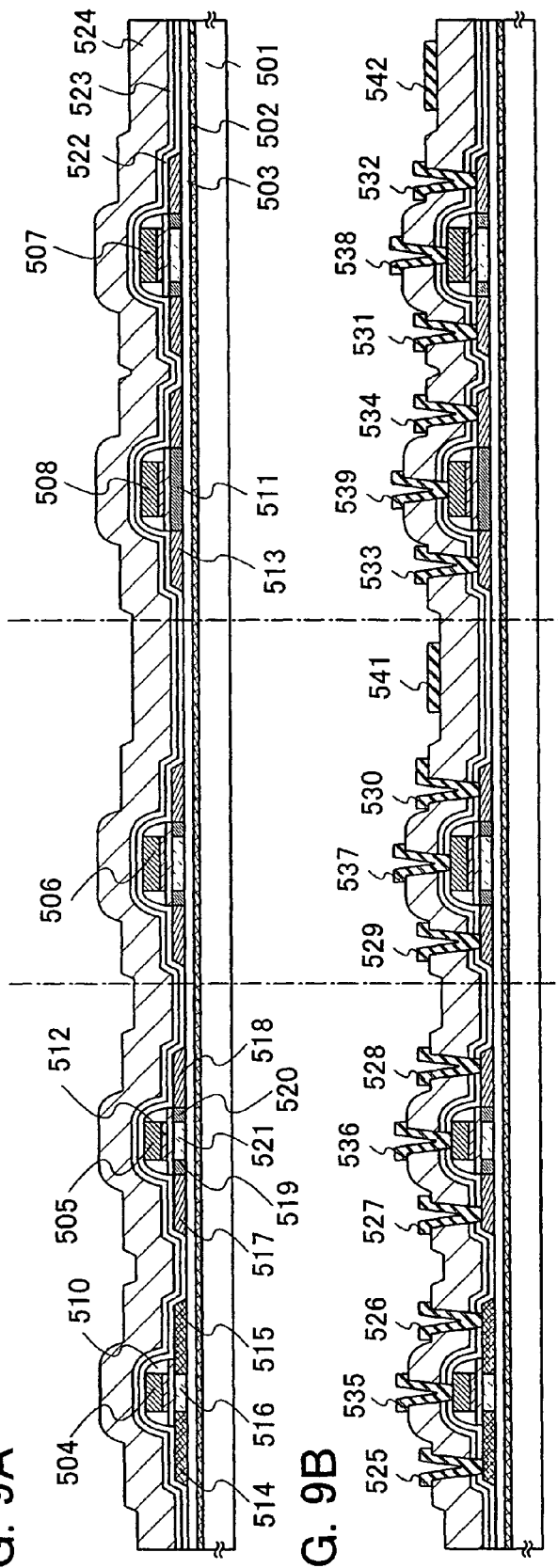

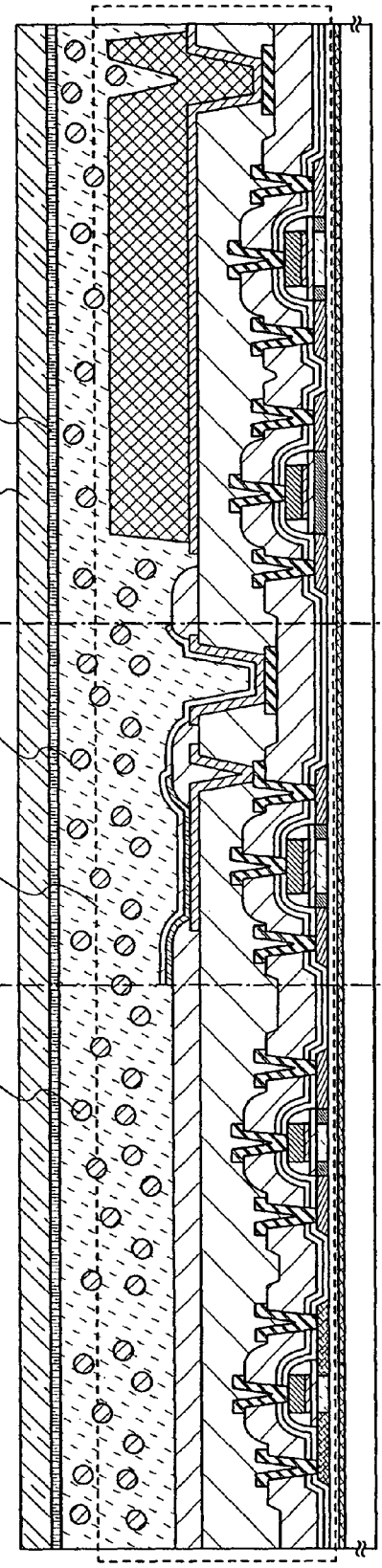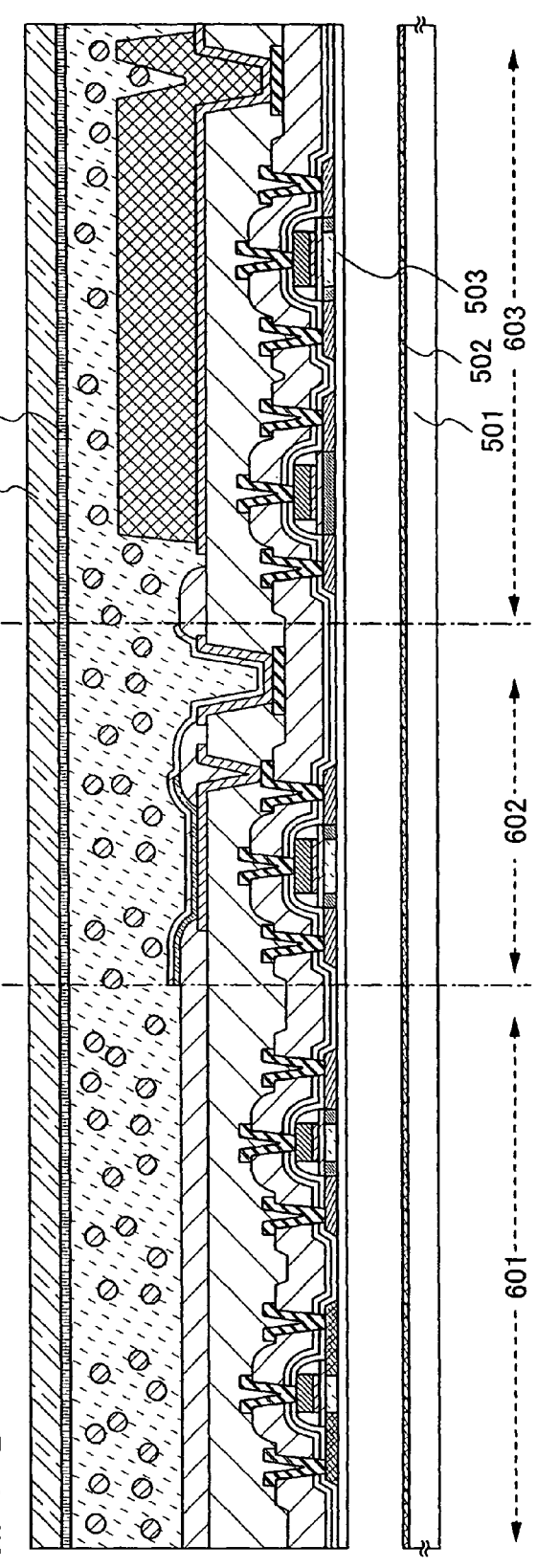
FIG. 11A
FIG. 11B

MEMORY DEVICE AND SEMICONDUCTOR DEVICE

BACKGROUND OF THE INVENTION

1. Field of the Invention

The present invention relates to a memory device and a semiconductor device bearing a memory element which has a layer including an organic compound.

2. Description of the Related Art

In recent years, an organic thin film transistor, a memory element, and the like, which include an organic compound, for a control circuit, a memory circuit, and the like have been intensively developed (for example, see Patent Document 1: Japanese Published Patent Application No. 2006-148080).

Further, a semiconductor device having various functions, in which a plurality of circuits is integrated on an insulating surface, has been developed. Furthermore, a semiconductor device which can transmit and receive data wirelessly by providing an antenna has been developed. Such a semiconductor device is referred to as a wireless chip (also referred to as an ID tag, an IC tag, an IC chip, an RF (Radio Frequency) tag, a wireless tag, an electronic tag, or an RFID (Radio Frequency Identification) tag), and has already been introduced into some marketplaces.

Many of these semiconductor devices that are currently in practical use each have a circuit using semiconductor such as Si (the circuit is also referred to as IC (Integrated Circuit) chip) and an antenna, and the IC chip includes a memory circuit (also referred to as a memory), a control circuit, and the like.

SUMMARY OF THE INVENTION

However, unfortunately, the memory element which has a layer containing an organic compound is readily damaged as shown in the Patent Document 1, depending on usage environments. As a result, undesirable reduction of reliability in storage function of the memory device and the semiconductor device, specifically, a writing characteristic, a reading characteristic, a memory storage characteristic, or the like frequently takes place.

In view of the foregoing problem, it is an object of the present invention to provide a flexible memory device and a flexible semiconductor device with a highly reliable storage function in which the element having a layer containing an organic compound is provided.

The memory device is characterized in that it has the memory element having a layer including an organic compound between a pair of electrodes formed of a first electrode layer and a second electrode layer, the element layer having the memory element, and the sealing layer formed over the element layer, and a moisture absorbing material is contained in the sealing layer.

Further, the semiconductor device is characterized in that it has the memory element having a layer including an organic compound between a pair of electrodes formed of the first electrode layer and the second electrode layer, the element layer having the memory element and a semiconductor element, and the sealing layer formed over the element layer, and a moisture absorbing material is contained in the sealing layer.

As the moisture absorbing material, a particle of molten silica, crystalline silica, alumina, silicon nitride, aluminum nitride, boron nitride, zeolite, an oxide of an alkaline earth metal, a sulfate of a metal or a high water-absorbing polymer is used. A grain diameter of the moisture absorbing material is 1 µm or more and 100 µm or less, preferably 5 µm or more and 30 µm or less, more preferably 5 µm or more and 10 µm or less.

The sealing layer is formed using a high-molecular material such as a polymer including fluorine, polyolefin, polyacrylonitrile, polyamide, polyester, or an epoxy resin.

As a semiconductor element, a transistor such as a MOS transistor, a thin film transistor or an organic semiconductor transistor, a capacitor, a resistor, or the like can be given. Further, the element layer may have the antenna.

Further, the memory device and the semiconductor device of the present invention have a function of storing information. The memory device and the semiconductor device of the present invention perform transmission/reception of instructions or data with radio signals and have a function of storing information which is transmitted or received by the radio signals and processing result obtained by instructions.

The memory device and the semiconductor device of the present invention include the memory element having a layer including an organic compound between a pair of electrodes formed of the first electrode layer and the second electrode layer, the element layer having the memory element, and the sealing layer formed over the element layer, and the moisture absorbing material is contained in the sealing layer. The moisture absorbing material is contained in the sealing layer, whereby, if water in an atmosphere to which the memory device or the semiconductor device is exposed enters the sealing layer, the moisture absorbing material contained in the sealing layer can absorb the water. Therefore, contact of water with the memory element which has a layer including an organic compound between a pair of electrodes formed of the first electrode layer and the second electrode layer can be suppressed.

As a result, deterioration of layers including the first electrode, the second electrode, and the organic compound, or the like, which is caused by water or vapor can be suppressed. Further, variation with time in the memory storage characteristic of the memory element can be suppressed, and a memory device and a semiconductor device with a highly reliable storage function can be manufactured. Furthermore, the element layer and the sealing layer are provided over a flexible substrate, whereby a memory device and a semiconductor device with high reliability in retention for storing data, which are extremely thin and flexible, can be manufactured.

BRIEF DESCRIPTION OF THE DRAWINGS

FIGS. 9A to 9C are cross sectional views illustrating a manufacturing step of a semiconductor device of the present invention.

FIGS. 11A and 11B are cross sectional views illustrating a manufacturing step of a semiconductor device of the present invention.

DETAILED DESCRIPTION OF THE INVENTION

Figure 1:
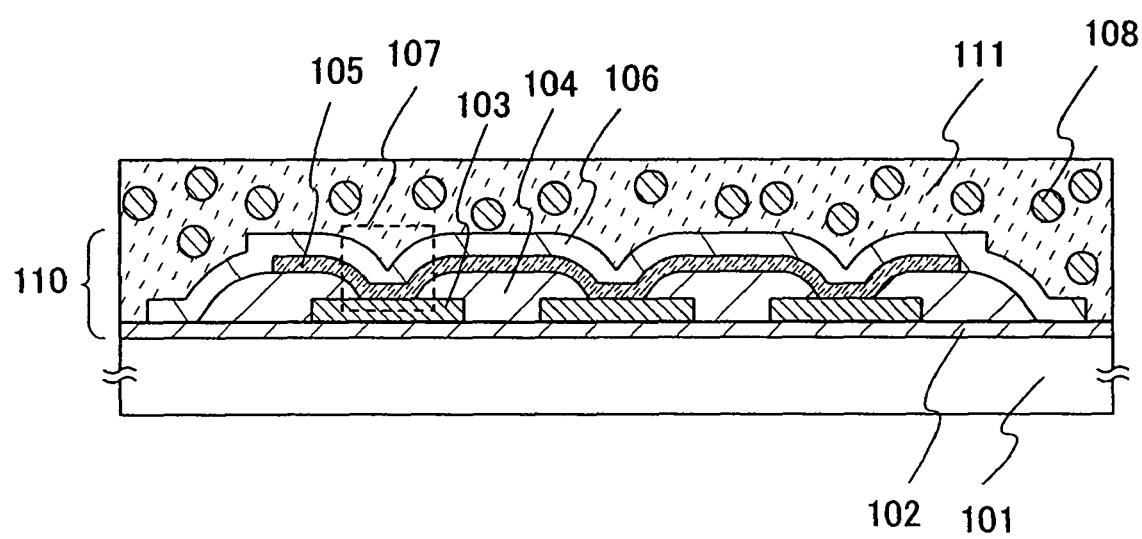
FIG. 1 is a cross sectional view illustrating a memory device of the present invention.

Embodiment modes of the present invention will hereinafter be described with reference to drawings. However, the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. Note that the same reference numerals are used to denote the same components among the different drawings in the structures of the present invention to be described below.

Embodiment Mode 1

In this embodiment mode, a main structure of a memory device of the present invention will be described. Typically, a memory device having a memory cell in which a memory element is provided will be explained with reference to FIG. 1, FIGS. 2A to 2C and FIGS. 4A to 4C. Note that each memory element has a layer including an organic compound between a pair of electrodes formed of a first electrode layer and a second electrode layer, and the memory cell are arrange in matrix in the memory device. Also, a structure of the memory element will be explained with reference to FIGS. 3A to 3F.

Figure 4A:
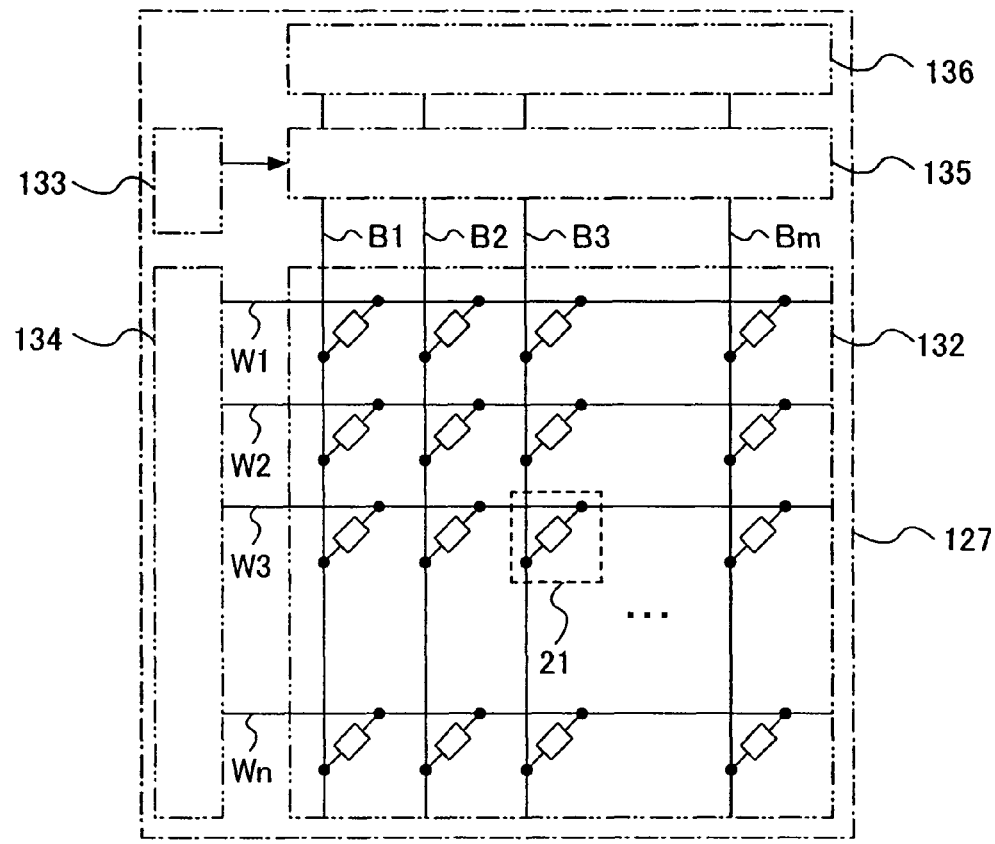
FIGS. 4A to 4C illustrate a structure of a memory device.

As shown in FIG. 4A, a memory device 127 has a memory cell array 132 and a driving circuit to drive the memory cell array. In the memory cell array 132, the memory cells 21 are provided in matrix. The memory cell 21 has a memory element 107 (see FIG. 1). The memory element 107 has the first electrode layer 103 extending in a first direction, a layer 105 including an organic compound which covers the first electrode layer 103, and the second electrode layer 106 extending in a second direction that intersects with the first direction over a substrate 101. Further, an insulating layer functioning as a protection film may be provided so as to cover the second electrode layer 106.

A cross-sectional structure of the memory cell array 132 shown in FIG. 4A will be explained using FIG. 1 and FIGS. 2A to 2C.

As shown in FIG. 1, an insulating layer 102 functioning as a base film is formed over the substrate 101. The first electrode layer 103 is formed over the insulating layer 102, and an insulating layer (or a partition) 104 is formed over the first electrode layer 103 and the insulating layer 102 functioning as a base film. Note that an opening is formed in the insulating layer (or a partition) 104 so that the first electrode layer 103 is exposed. The layer 105 including an organic compound is formed over the insulating layer (or a partition) 104 and the first electrode layer. The second electrode layer 106 is formed over the layer 105 including an organic compound, the insulating layer (or a partition) 104, and the insulating layer 102 functioning as a base film.

The memory element 107 includes the first electrode layer 103, the layer 105 including an organic compound, and the second electrode layer 106. Here, a stack of the insulating layer 102 functioning as a base film through the second electrode layer 106 is referred to as an element layer 110.

A sealing layer 111 containing moisture absorbing materials 108 is formed over the element layer 110.

The sealing layer 111 is preferably formed by applying a composition by a coating method and then curing by heating or light irradiation. Since the sealing layer 111 is provided as a protection layer working in a later peeling step, the sealing layer 111 is preferably an insulating layer which has little depression and projection on the surface. Such an insulating layer can be formed by a coating method.

The sealing layer 111 formed by a coating method is formed of a polymer including fluorine, a polyolefin, polyacrylonitrile, a polyamide, a polyester, an epoxy resin, an inorganic siloxane polymer typified by silica glass, which is prepared from a siloxane polymer as a starting material, or an organic siloxane polymer typified by an alkylsiloxane polymer, an alkylsilsesquioxane polymer, a silsesquioxane hydride polymer, and an alkylsilsesquioxane hydride polymer, in which hydrogen on silicon is substituted by an organic group such as a methyl or a phenyl group.

A typical example of a polymer including fluorine is a polytetrafluoroethylene, polychlorotrifluoroethylene, polyvinydenfluoride, an ethylene-tetrafluoroethylene copolymer or the like.

Typical examples of polyolefin are polymers such as polyethylene, polypropylene, polybutadiene, polyisoprene, and polystyrene and copolymers thereof.

Typical examples of an epoxy resin are a cresol novolac type epoxy resin, a dicyclopentadiene type epoxy resin, a triphenylmethane type epoxy resin, a bromine-containing epoxy resin, an epoxy resin containing a naphthalene ring and the like.

As a moisture absorbing material 108, a particle with a high moisture absorbing property and with a diameter of 1 μm or more and 100 μm or less, preferably 5 μm or more and 30 μm or less, and more preferably 5 μm or more and 10 μm or less can be used. A typical example of a particle with a high moisture absorbing property is a particle such as molten silica, crystalline silica, alumina, silicon nitride, aluminum nitride, boron nitride, zeolite, an oxide of an alkaline earth metal, a sulfate of a metal, and a high water-absorbing polymer.

A typical example of an oxide of an alkaline earth metal is calcium oxide, barium oxide, magnesium oxide, strontium oxide or the like.

A typical example of a sulfate of a metal is lithium sulfate, sodium sulfate, calcium sulfate, magnesium sulfate, cobalt sulfate, gallium sulfate, titanium sulfate, nickel sulfate or the like.

A typical example of a high water-absorbing polymer is a vinyl polymer such as poly(vinyl alcohol) or polyvinylpyrrolidone, or a condensation polymer such as polyether, polyester, polyamide, or the like. Note that a high water-absorbing polymer is a polymer which has ability to absorb water with weight of one to several hundred times as heavy as its weight and hold the water without dissolving in water.

Further, a shape of the moisture absorbing material 108 is spherical, columnar, polyhedral or the like. Also, the moisture absorbing material 108 may have depression and projection on the surface in order to increase an area for absorbing water. A pore may be formed on a surface of the moisture absorbing material.

A proportion of the moisture absorbing material 108 in the sealing layer 111 is not limited; however, the proportion of the moisture absorbing material 108 is preferably 1 to 20 wt %, more preferably 5 to 15 wt % with respect to a high molecular material, an inorganic siloxane polymer or an organic siloxane polymer which form the sealing layer 111.

The moisture absorbing material 108 can absorb and/or adsorb water absorbed by the sealing layer 111, which is achieved by providing the moisture absorbing material 108 in the sealing layer 111. Therefore, water contained in an outside air of the memory device can be prevented from entering the element layer 110 where the first electrode layer, the second electrode layer, the layer including the organic compound and the like are formed, which leads to prevention of them from deteriorating.

Here, the sealing layer 111 is formed by applying an epoxy resin containing a calcium oxide particle as the moisture absorbing material 108 by a coating method, which is followed by drying and baking the epoxy resin.

As the substrate 101, a glass substrate, a quartz substrate, a metal substrate or a stainless steel substrate having an insulating layer formed over one surface thereof, a plastic substrate which can withstand the treatment temperature of the process in this embodiment, or the like is used. Since the above-mentioned substrate 101 is not limited in size or shape, a rectangular substrate with a length of 1 meter or more on one side, for example, can be used as the substrate 101 to drastically increase productivity. This advantage is very superior to that of a circular silicon substrate.

The insulating layer 102 functioning as a base film is formed with an inorganic compound in a single-layer or multilayer structure by a sputtering method, a plasma CVD method, a coating method, a printing method, or the like. As a typical example of an inorganic compound, silicon oxide, silicon nitride, silicon oxynitride, silicon nitride oxide, or the like can be given. Note that when silicon nitride, silicon nitride oxide, silicon oxynitride or the like is used for the insulating layer 102 functioning as a base film, water or gas such as oxygen and carbon dioxide can be prevented from entering the element layer, which is formed, afterward, from outside.

Further, the insulating layer 102 functioning as a base film may have a stacked layer structure. For example, the stacked layer structure may include an inorganic compound. Typically, the insulating layer 102 may be formed by stacking silicon oxide, silicon nitride oxide and/or silicon oxynitride.

The first electrode layer 103 can be formed in a single-layer or multilayer structure formed of a metal, alloy, compound, or the like having high conductivity by a sputtering method, a plasma CVD method, a coating method, a printing method, an electrolytic plating method, an electroless plating method, or the like.

As the first electrode layer 103, indium tin oxide (hereinafter, referred to as ITO), indium tin oxide containing silicon oxide, indium oxide containing 2 to 20 atomic % zinc oxide, or the like can be given. Further, titanium (Ti), gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride, tungsten nitride, molybdenum nitride), or the like can be used.

Further, as the first electrode layer 103, an alkali metal such as lithium (Li) or cesium (Cs), an alkaline earth metal such as magnesium (Mg), calcium (Ca), or strontium (Sr), aluminum (Al), an alloy containing any of these metals, a rare earth metal such as europium (Eu) or ytterbium (Yb), an alloy containing any of these metals, and the like can be given.

Furthermore, the first electrode layer 103 can be formed of a tin alloy. As typical examples of a tin alloy, an alloy of tin and silver, an alloy of tin and bismuth, an alloy of tin and antimony, an alloy of tin and copper, an alloy of tin and gold, an alloy of tin and zinc, an alloy of tin and indium, and the like are given.

The layer 105 including an organic compound can be formed by an evaporation method, an electron beam evaporation method, a coating method, or the like.

Here, after forming a titanium layer with a thickness of 50 to 200 nm by a sputtering method, the titanium film is etched to have a desired shape by a photolithography method to form the first electrode layer 103. Next, the layer including an organic compound is formed with NPB by an evaporation method.

The second electrode layer 106 can be formed by an evaporation method, a sputtering method, a CVD method, a printing method, a coating method, or the like. The second electrode layer 106 can be formed by using appropriately the same material as that of the first electrode layer 103. Further, the second electrode layer 106 can be formed by using a tin alloy. A typical example of a tin alloy is an alloy of tin and silver, an alloy of tin and bismuth, an alloy of tin and antimony, an alloy of tin and copper, an alloy of tin and gold, an alloy of tin and zinc, an alloy of tin and indium, or the like. Further, the second electrode layer 106 may be formed by using a tin alloy layer including some kinds of elements selected from silver, bismuth, antimony, copper, gold, zinc and indium.

The second electrode layer 106 can have a stacked layer structure. Typically, after forming a tin alloy layer as a first layer, a metal layer of titanium (Ti), gold (Au), platinum (Pt), nickel (Ni), tungsten (W), chromium (Cr), molybdenum (Mo), iron (Fe), cobalt (Co), copper (Cu), palladium (Pd), aluminum (Al), magnesium (Mg), nitride of a metal material (e.g., titanium nitride, tungsten nitride, molybdenum nitride), or the like may be formed as a second layer. By forming the second layer, when high current is applied in writing data into a memory element, the tin alloy layer of the first layer can be prevented from separating from the neighboring layers.

Here, tin and silver are evaporated at the same time by an evaporation method, and the second electrode layer 106 is formed with an alloy of tin and silver.

Here, a more specific structure of the memory element 107 is hereinafter shown with reference to FIGS. 3A to 3F.

Figure 3A:
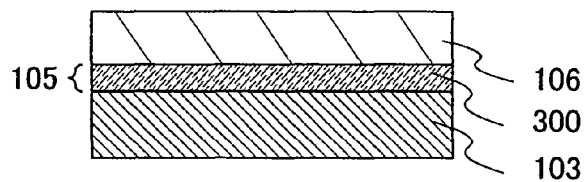
FIGS. 3A to 3F are cross sectional views illustrating a structure of a memory element applicable to the present invention.

As shown in FIG. 3A, a layer 105 including an organic compound is formed to be a layer that changes in a crystal condition, conductivity, and a shape by applying voltage to the first electrode layer 103 and the second electrode layer 106, whereby the memory element 107 is formed. By applying voltage to the first electrode layer 103 and the second electrode layer 106, a crystal condition, conductivity, and a shape of the layer 105 including an organic compound change, whereby electric resistance of the memory element is changed. By using this change, data of "0" or "1" can be stored.

Here, the layer 105 including an organic compound is formed of an organic compound layer 300. Note that the organic compound layer 300 can have a single-layer or multilayer structure of organic compounds.

The thickness of the layer 105 including an organic compound is preferably set so that the electric resistance of the memory element changes by applying voltage to the first electrode layer 103 and the second electrode layer 106. A typical thickness of the layer 105 including an organic compound is 1 to 100 nm, preferably, 10 to 60 nm, more preferably, 5 to 30 nm.

The organic compound layer 300 can be formed with an organic compound having a hole-transporting property or an organic compound having an electron-transporting property.

As the organic compound having a hole-transporting property, for example, phthalocyanine (abbreviation: $H_2Pc$), copper phthalocyanine (abbreviation: CuPc), and vanadyl phthalocyanine (abbreviation: VOPC) are given. Besides them, the following are given: 4,4',4"-tris(N,N-diphenylamino)triphenylamine (abbreviation: TDATA); 4,4',4"-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); 4,4'-bis{N-[4-di(m-tolyl)amino]phenyl-N-phenylamino}biphenyl (abbreviation: DNTPD); 4,4'-bis[N-(4-biphenylyl)-N-phenylamino]biphenyl (abbreviation: BBPB); 4,4',4"-tri(N-carbazolyl)triphenylamine (abbreviation: TCTA); and the like. However, the present invention is not limited to these compounds. The substances mentioned here mainly have a hole mobility of $10^{-6}$ $cm^2/Vs$ or higher.

As the organic compound having an electron-transporting property, the following metal complexes having a quinoline skeleton or a benzoquinoline skeleton, or the like can be used: tris(8-quinolinolato)aluminum (abbreviation: $Alq_3$); tris(4-methyl-8-quinolinolato)aluminum (abbreviation: $Almq_3$); bis(10-hydroxybenzo[h]-quinolinato)beryllium (abbreviation: $BeBq_2$); bis(2-methyl-8-quinolinolato)-4-phenylphenolato-aluminum (BAlq); and the like. Besides them, the following material of a metal complex having an oxazole-based ligand or a thiazole-based ligand, or the like can also be used: bis[2-(2-hydroxyphenyl)benzoxazolato]zinc (abbreviation: $Zn(BOX)_2$); bis[2-(2-hydroxyphenyl)benzothiazolato]zinc (abbreviation: $Zn(BTZ)_2$); and the like. Furthermore, in addition to such metal complex, 2-(4-biphenylyl)-5-(4-tert-butylphenyl)-1,3,4-oxadiazole (abbreviation: PBD); 1,3-bis[5-β-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like can also be used. The substances mentioned here mainly have an electron mobility of $10^{-6}$ $cm^2/Vs$ or higher.

Note that a material having mobility outside the above range, for example, 2,3-bis(4-diphenylaminophenyl)quinoxaline (abbreviation: TPAQn), 9-[4-(N-carbazolyl)]phenyl-10-phenylanthracene (hereinafter, referred to as CzPA), or the like, may also be used.

Further, the organic compound layer 300 may be formed using a mixture of a plurality of the above-mentioned organic compounds. Furthermore, the organic compound layer 300 may be formed by stacking the above-mentioned organic compounds.

In addition, in the organic compound layer 300, an insulator may also be mixed into the organic compound having a hole-transporting property or an electron-transporting property. Note that the insulator is not required to be dispersed uniformly. Morphology of the organic compound layer 300 can be improved by mixing the insulator into the organic compound. Thus, since partial crystallization of the film can be suppressed, variations of behavior of memory elements can be further reduced.

Figure 3B:
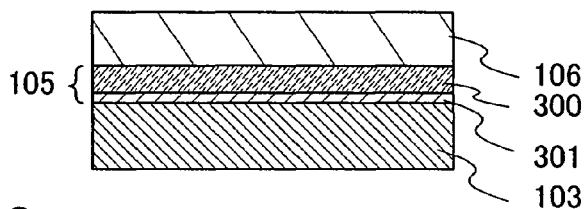

Further, as shown in FIG. 3B, the layer 105 including an organic compound may be formed of the organic compound layer 300 and a buffer layer 301. The buffer layer 301 is formed of an inorganic compound or an organic compound that is stable thermally and chemically. Typically, the buffer layer 301 is formed using an inorganic insulator, an inorganic semiconductor or an organic insulator.

When the buffer layer 301 is formed of an inorganic insulator or an organic insulator, the buffer layer 301 is a layer for injecting charges of holes or electrons from the first electrode layer or the second electrode layer to the organic compound layer, by a tunnel effect. The buffer layer 301 has a thickness capable of injecting charges to the organic compound layer 300 by a tunnel effect at a predetermined voltage. A typical thickness of the buffer layer 301 as an insulator is 0.1 nm or more and 4 nm or less, preferably, 0.1 nm or more and 2 nm or less. Since the thickness of the buffer layer 301 is as thin as 0.1 nm or more and 4 nm or less, the tunnel effect is generated in the buffer layer 301, so that a charge injecting property to the organic compound layer 300 is improved. Accordingly, when the thickness of the buffer layer 301 exceeds 4 nm, the tunnel effect does not appear in the buffer layer 301, so that it is difficult to inject charges to the organic compound layer 300; thus, the voltage to be applied at the writing into the memory element increases.

A typical example of an inorganic insulator which forms the buffer layer 301 is an oxide having an insulating property typified by lithium oxide, sodium oxide, potassium oxide, rubidium oxide, beryllium oxide, magnesium oxide, calcium oxide, strontium oxide, barium oxide, cesium oxide, zirconium oxide, hafnium oxide, francium oxide, tantalum oxide, technetium oxide, manganese oxide, iron oxide, cobalt oxide, palladium oxide, silver oxide, alumina, gallium oxide, bismuth oxide or the like.

Further, typical examples of an inorganic insulator which forms the buffer layer 301 are fluoride having an insulating property typified by lithium fluoride, sodium fluoride, potassium fluoride, cesium fluoride, beryllium fluoride, magnesium fluoride, calcium fluoride, strontium fluoride, barium fluoride, aluminum fluoride, silver fluoride, manganese fluoride, or the like; chloride having an insulating property typified by lithium chloride, sodium chloride, potassium chloride, cesium chloride, beryllium chloride, calcium chloride, barium chloride, aluminum chloride, tin chloride, silver chloride, zinc chloride, titanium chloride, strontium chloride, iron chloride, palladium chloride, antimony chloride, strontium chloride, thallium chloride, copper chloride, manganese chloride, ruthenium chloride, or the like; bromide having an insulating property typified by calcium bromide, cesium bromide, silver bromide, barium bromide, lithium bromide, or the like; and iodide having an insulating property typified by sodium iodide, potassium iodide, barium iodide, thallium iodide, silver iodide, titanium iodide, calcium iodide, silicon iodide, cesium iodide, or the like.

Typical examples of an inorganic insulator which forms the buffer layer 301 are carbonate having an insulating property typified by lithium carbonate, calcium carbonate, sodium carbonate, manganese carbonate, strontium carbonate, barium carbonate, iron carbonate, cobalt carbonate, nickel carbonate, copper carbonate, silver carbonate, zinc carbonate, or the like; sulfate having an insulating property typified by lithium sulfide, calcium sulfide, sodium sulfide, magnesium sulfide, strontium sulfide, barium sulfide, titanium sulfide, zirconium sulfide, manganese sulfide, iron sulfide, cobalt sulfide, nickel sulfide, copper sulfide, silver sulfide, zinc sulfide, aluminum sulfide, indium sulfide, tin sulfide, antimony sulfide, bismuth sulfide, or the like; nitrate having an insulating property typified by lithium nitrate, potassium nitrate, sodium nitrate, magnesium nitrate, calcium nitrate, strontium nitrate, barium nitrate, titanium nitrate, zirconium nitrate, manganese nitrate, iron nitrate, cobalt nitrate, nickel nitrate, copper nitrate, silver nitrate, zinc nitrate, aluminum nitrate, indium nitrate, tin nitrate, or the like; and nitride having an insulating property typified by aluminum nitride, silicon nitride, or the like.

Note that when the buffer layer 301 is formed of an inorganic insulator, the thickness of the buffer layer 301 is preferably 0.1 nm or more and 4 nm or less. When the insulating layer has the thickness of 4 nm or more, the voltage to be applied at writing increases.

A typical example of an organic insulator which forms the buffer layer 301 is an organic compound typified by polyimide, acrylic resin, polyamide, benzocyclobutene resin, polyester, novolac resin, melamine resin, phenol resin, epoxy resin, silicone resin, furan resin, diallyl phthalate resin, or the like.

A typical examples of an inorganic semiconductor which forms the buffer layer 301 is a semiconductor such as silicon, germanium, molybdenum oxide, tin oxide, bismuth oxide, vanadium oxide, titanium oxide, iron oxide, chromium oxide, copper oxide, manganese silicon oxide, nickel oxide, zinc oxide, silicon germanium, gallium arsenide, gallium nitride, indium oxide, indium phosphide, indium nitride, cadmium sulfide, cadmium telluride, or strontium titanate. Note that the buffer layer 301 does not always have to be formed of one kind of semiconductor. The buffer layer 301 may be formed by mixing a plurality of semiconductor materials.

Note that when the buffer layer 301 is formed of an inorganic semiconductor, the thickness of the buffer layer 301 is not particularly limited as long as it is greater than or equal to 0.1 nm, and the thickness may be as thin as 10 nm or less or may be greater than or equal to 10 nm, for example.

The buffer layer 301 may be a single layer with a layer formed of an inorganic insulator, an organic insulator and a semiconductor which are different from each other, or may be a multilayer by stacking layers formed of an inorganic insulator, an organic insulator and a semiconductor which are different from each other. For example, a stacked layer of an inorganic insulator layer and a semiconductor layer, a stacked layer of an inorganic insulator layer and an organic insulator layer, a stacked layer of an organic insulator layer and a semiconductor layer, or the like, can be as appropriate used.

The buffer layer 301 can be formed by an evaporation method, an electron beam evaporation method, a sputtering method, a CVD method, or the like. Further, a spin coating method, a sol-gel method, a printing method, a droplet discharge method, or the like, can be used.

Figure 3C:
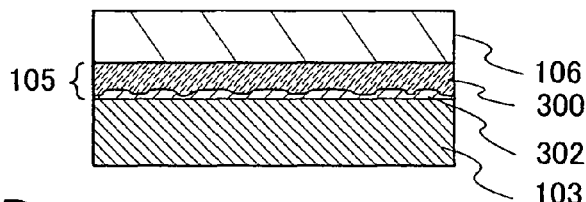

As shown in FIG. 3C, the layer 105 including an organic compound may be formed by using the organic compound layer 300 and a continuous buffer layer 302 having depression and projection. However, it is preferable that the thickness at the projection portion of the buffer layer be 0.1 nm or more and 10 nm or less, preferably 2 nm or more and 8 nm or less, and that at the depression portion of the buffer layer be 0.1 nm or more and less than 4 nm, preferably 0.1 nm or more and less than 2 nm.

Figure 3D:
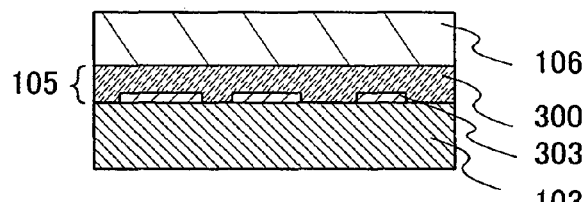

As shown in FIG. 3D, the layer 105 including an organic compound may be formed by using the organic compound layer 300 and a discontinuous insulating layer 303 dispersed. The discontinuous insulating layer 303 may have an island shape, a stripe shape, a net-like shape, or the like.

Moreover, an insulating particle may be provided instead of the buffer layers 301 to 303. The insulating particle in this case preferably has a grain size of 0.1 nm or more and 4 nm or less.

Note that in FIGS. 3B to 3D, the buffer layers 301 to 303 are provided between the first electrode layer 103 and the organic compound layer 300; however, the buffer layers 301 to 303 may be provided between the second electrode layer 106 and the organic compound layer 300.

Figure 3E:
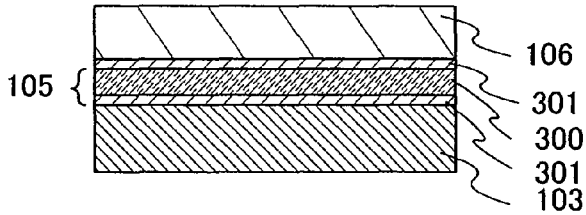

Further, as shown in FIG. 3E, the buffer layers 301 to 303 or the insulating particles may be provided between the first electrode layer 103 and the organic compound layer 300, and between the organic compound layer 300 and the second electrode layer 106.

A buffer layer formed of an inorganic insulator or an organic insulator with a thickness of 4 nm or less, preferably 2 nm or less is provided between the first electrode layer 103 and the organic compound layer 300, or between the organic compound layer 300 and the second electrode layer 106, whereby tunnel current flows through the insulating layer. Therefore, variations of the applied voltage and amount of current which are required in writing data in the memory element can be reduced. Further, the employment of a buffer layer formed of an inorganic insulator or an organic insulator with a thickness of 4 nm or less, preferably 2 nm or less between the first electrode layer 103 and the organic compound layer 300, or between the organic compound layer 300 and the second electrode layer 106 improves the charge injecting property due to a tunnel effect, which allows the use of the organic compound layer 300 with an increased thickness and eventually makes it possible to prevent short-circuiting in an initial state. As a consequence, reliability of a memory device and a semiconductor device can be improved.

Figure 3F:
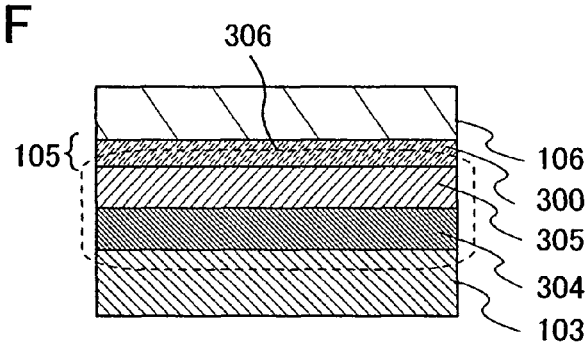

As a different structure from the aforementioned one, an element having a rectifying property may be provided between the first electrode layer 103 and the layer 105 including an organic compound, or between the second electrode layer 106 and the layer 105 including an organic compound (FIG. 3F). As the element having a rectifying action, typically, a Schottky diode, a diode having a PN junction, a diode having a PIN junction, a transistor in which a gate electrode is connected to a drain electrode, or the like, is given. Needless to say, a diode having another structure may also be used. Here, a case is shown, in which a PN junction diode 306 including semiconductor layers 304 and 305 is provided between the first electrode layer 103 and the layer 105 including the organic compound. One of the semiconductor layers 304 and 305 is an N-type semiconductor while the other is a P-type semiconductor. By providing the element having a rectifying property in this way, reading characteristic and writing characteristic can be improved.

Figure 2A:
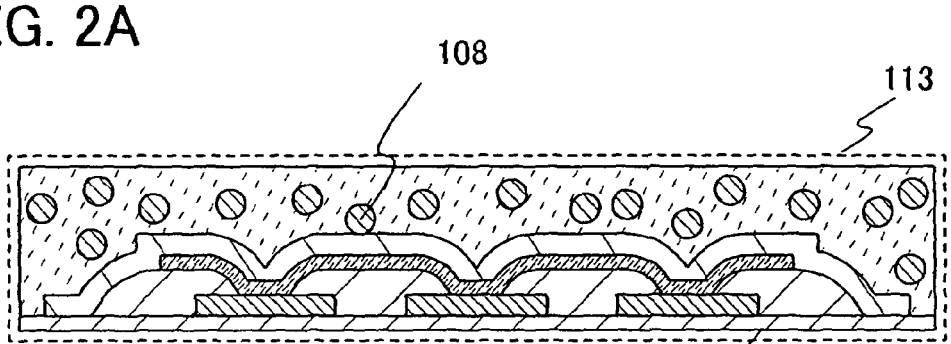
FIGS. 2A to 2C are cross sectional views illustrating a memory device of the present invention.

Further, the element layer and the sealing layer may be peeled off the substrate to provide a flexible memory device 113 as shown in FIG. 2A. In this case, the insulating layer 102 functioning as a base film is preferably formed of a layer having a passivation effect. A typical insulating layer 102 is preferably formed by using a silicon nitride layer or a silicon nitride oxide layer.

In order to peel the element layer and the sealing layer which are formed over the substrate, a peeling layer is preferably formed between the substrate and the insulating layer 102 functioning as a base film. In other words, it is preferred to use the peeling layer to facilitate the peeling of the element layer and the sealing layer from the substrate.

The peeling layer is formed with a single layer or a plurality of layers formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or silicon (Si), or an alloy or a compound (typically, oxide or nitride) containing the above-described element as its main component by a sputtering method, a plasma CVD method, a coating method, a printing method, or the like. In the case of using silicon as the peeling layer, the crystalline structure of a layer containing silicon may be any one of an amorphous, microcrystalline, or polycrystalline structure.

As an example of a peeling method, a metal layer and a metal oxide layer formed of any of the above metals are formed as a peeling layer, and then the substrate 101 having the peeling layer and the element layer 110 are peeled off each other by a physical method. The physical method refers to a dynamic method or a mechanical method, which provides some dynamic energy (mechanical energy) to the semiconductor device. The typical physical method refers to mechanical power addition (for example, peeling by a human hand or a gripper or separation treatment by rotating a roller).

As another example of a peeling method, an amorphous silicon layer containing hydrogen is provided as a peeling layer between the substrate and the element layer, and hydrogen gas contained in the amorphous silicon layer is released by laser beam irradiation, by which the element layer is peeled off the substrate.

As another example of a peeling method, a peeling layer having a metal layer and a metal oxide layer is formed between the substrate and the element layer, the metal oxide layer is weakened by crystallization, and the peeling layer is removed by etching with a liquid etchant, $NF_3$ or a halogen fluoride gas such as $BrF_3$ and $ClF_3$.

As another example of a peeling method, only the substrate 101 over which the element layer 110 and the sealing layer 111 are formed is mechanically removed or the substrate 101 is removed by etching.

As another example of a peeling method, a metal layer and a metal oxide layer are provided as a peeling layer between the substrate 101 and the element layer 110, the metal oxide layer is weakened by crystallization and a part of the metal layer is etched by a liquid etchant, $NF_3$ or a halogen fluoride gas such as $BrF_3$ and $ClF_3$. Then, by using the physical method mentioned above, physical peeling is performed at the weakened metal oxide layer.

Figure 2B:
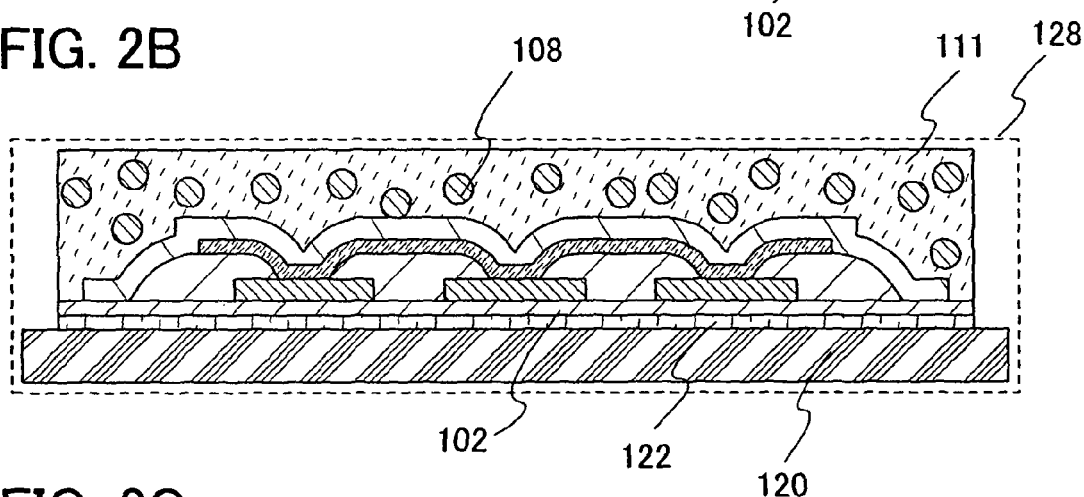

Further, as shown in FIG. 2B, a flexible substrate 120 may be attached to the insulating layer 102 functioning as a base film by using an adhesive 122, giving a memory device 128. By this process, the element layer 110 and the sealing layer 111 are provided over the flexible substrate 120. Such a flexible memory device 128 is thin and has high mechanical strength.

The flexible substrate 120 is preferably a flexible, thin, and lightweight substrate. Typically, a plastic substrate such as PET (poly(ethylene terephthalate)), PEN (poly(ethylene naphthalate)), PES (polyethersulfone), polypropylene, poly(propylene sulfide), polycarbonate, polyetherimide, poly(phenylene sulfide), poly(phenylene oxide), polysulfone or polyphthalamide, or the like, paper made of a fibrous material, a ceramic sheet, or the like can be used. In a case where the substrate is used, the adhesive 122 is provided between the sealing layer 111 and the flexible substrate 120, and the sealing layer 111 and the flexible substrate 120 are attached to each other.

Moreover, as the flexible substrate 120, paper made of a fibrous material, a stacked layer film including a base material film (polyester, polyamide, a film with an inorganic thin layer formed by evaporation, or the like) and an adhesive organic resin film (an acrylic resin, an epoxy resin, or the like), or the like can also be used. In a case where the substrate is used, the flexible substrate 120 is attached to the insulating layer 102 by thermocompression, and the adhesive organic resin film is cured after being plasticized, whereby the insulating layer 102 can be attached to the stacked layer film. In this case, the adhesive 122 is not necessarily provided between the insulating layer 102 and the flexible substrate 120.

The mechanical strength of the memory device 128 like this can be enhanced by providing the flexible substrate over one surface of the element layer 110 or the sealing layer 111.

Figure 2C:
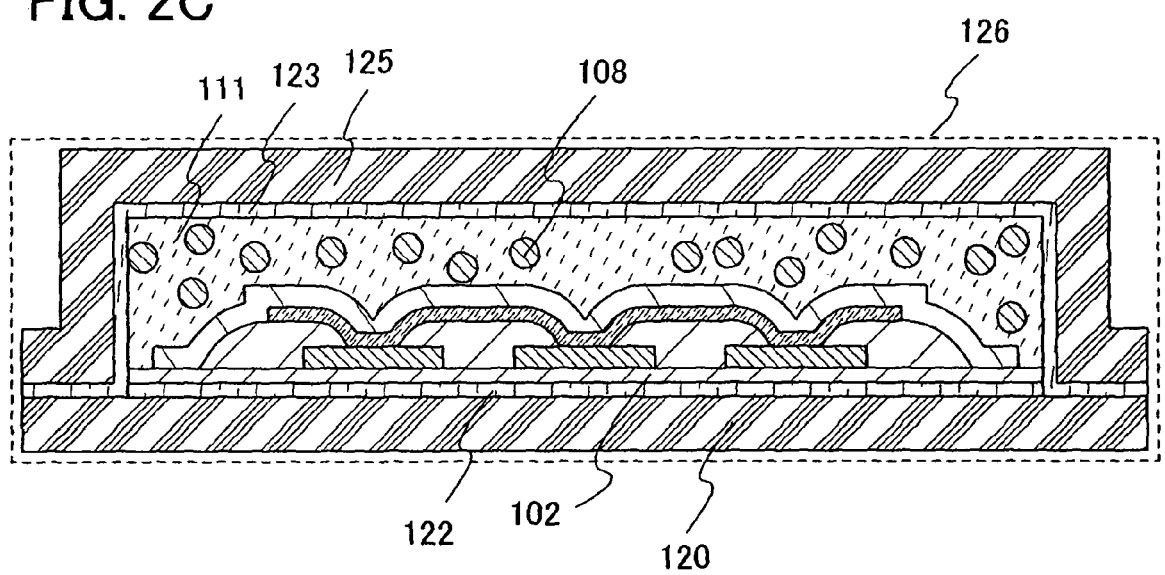

As shown in FIG. 2C, a flexible substrate 125 is attached to the sealing layer 111 by using an adhesive 123, whereby a memory device 126 can be formed. That is, the element layer 110 and the sealing layer 111 are sealed with the flexible substrates 120 and 125.

In the memory device 126 like this, the surrounding area of the element layer and the sealing layer 111 is sealed with the flexible substrate. Therefore, the mechanical strength and resistance to external environment can be improved.

Figure 4B:
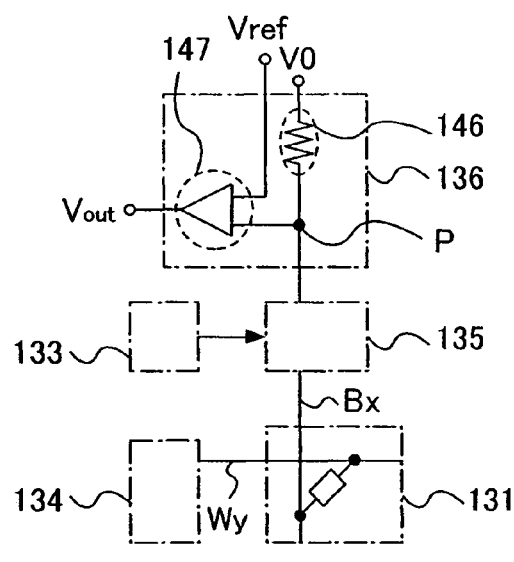
Figure 4C:
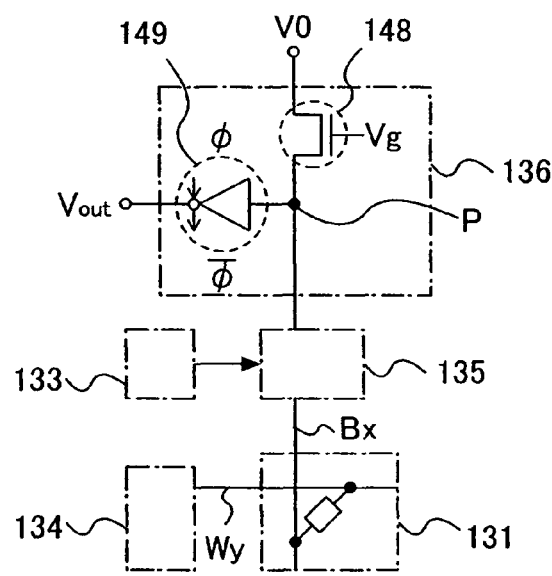

Next, data writing operations and data reading operations of the above-described memory device will be explained using FIGS. 4A to 4C.

As shown in FIG. 4A, the memory cell 21 has the first electrode layer which is connected to a word line Wy ($1 \leq y \leq n$), the second electrode layer which is connected to a bit line Bx ($1 \leq x \leq m$), and the layer including an organic compound. The layer including an organic compound is provided between the first electrode layer and the second electrode layer.

Operations performed while writing of data to a memory cell is being performed will be explained. A case where data is written by electric action will be explained. Note that the writing is performed by changing electrical characteristics of a memory cell; and an initial state (a state in which electric action is not applied) of the memory cell is denoted by data "0", while the state in which the electrical characteristics are changed is denoted by data "1".

When data of "1" is written to the memory cell 21, first, the memory cell 21 is selected by the decoders 133 and 134 and the selector 135. For example, by the decoder 134, a given voltage V2 is applied to a word line W3 connected to the memory cell 131. In addition, a bit line B3 connected to the memory cell 21 is connected to a reading/writing circuit 136 by the decoder 133 and the selector 135. A writing voltage V1 is output to the bit line B3 from the reading/writing circuit 136. In this way, a voltage Vw=V1−V2 is applied between the first electrode layer and the second electrode layer forming the memory cell 21. By selecting the potential Vw appropriately, the characteristics of the layer including an organic compound provided between the conductive layers is changed physically or electrically, and writing of data of "1" is performed. Specifically, the writing voltage is set at a voltage that the electric resistance, at a reading operation voltage, between the first electrode layer and the second electrode layer in a state of data of "1" is changed so that the electric resistance is much smaller than the resistance in a state of data of "0". The voltage Vw is set from 5 V to 15 V or from −5V to −15 V. For example, the voltage Vw can be set where (V1, V2)=(0 V, from 5V to 15 V), (V1, V2)=(from 3 V to 5 V, from −12 V to −2 V), or the like.

Note that writing is controlled so that data of "1" is not written in a memory cell connected to a non-selected word line or a non-selected bit line. For example, the non-selected word line and the non-selected bit line may be placed in a floating state. It is necessary to provide a characteristic such as diode characteristics or the like, by which selectivity can be maintained, to the memory element in the memory cell.

On the other hand, when data of "0" is written to the memory cell 21, electric action need not be performed on the memory cell 21. In circuit operations, for example, even though, as in when data of "1" is written, the memory cell 21 is selected by the decoders 133 and 134 and the selector 135, an output potential to the bit line B3 from the reading/writing circuit 136 is set to be approximately equal to a potential of the selected word line W3 or that of non-selected word line. Namely, a voltage (for example, −5 to 5 V), by which an electric characteristic of the memory cell 21 is not changed, is applied between the first and second electrode layers included in the memory cell 131.

Next, operations for reading of data from the memory cell will be explained (see FIGS. 4B and 4C). The data reading is carried out by utilizing the difference in electrical characteristics of a memory cell having a data "0" from that of a memory cell having a data "1". For example, a method for reading out data by utilizing a difference in electric resistance will be described in a case where effective electric resistance between the first and second electrode layers included in the memory cell having the data "0" (hereinafter, simply referred to as electric resistance of the memory cell) is R0 at a reading voltage and electric resistance of the memory cell having data "1" is R1 at the reading voltage. R1 and R0 are set so that R1<<R0. As a structure of a reading portion of the reading/writing circuit, for example, the reading/writing circuit 136 including a resistor element 146 and a differential amplifier 147 shown in FIG. 4B can be given. The resistor element 146 has a resistance value Rr, wherein R1<Rr<R0. A transistor 148 may be used as a substitute for the resistor element 146, or a clocked inverter 149 can be used as a substitute for the differential amplifier (FIG. 4C). A signal or an inverted signal, which becomes Hi when reading is carried out and Low when reading is not carried out, is inputted to the clocked inverter 149. Note that the circuit structure is not limited to those shown in FIGS. 4B and 4C.

When reading of data from the memory cell 21 is performed, first, the memory cell 21 is selected by the decoders 133 and 134 and the selector 135. Specifically, a predetermined voltage Vy is applied to a word line W3 connected to the memory cell 21 by the decoder 134. In addition, by the decoder 133 and the selector 135, a bit line B3 connected to the memory cell 21 is connected to a terminal P of the reading/writing circuit 136. As a result, a potential Vp of the terminal P, becomes a value determined based on resistance division by the resistor element 146 (resistance value: Rr) and the memory cell 21 (resistance value: R0 or R1). Accordingly, if the memory cell 21 has the data "0", Vp0=Vy+(V0−Vy)×R0/(R0+Rr). Further, when the memory cell 21 has the data "1", Vp1=Vy+(V0−Vy)×R1/(R1+Rr). As a result, as in FIG. 4B, so that Vref is between Vp0 and Vp1, and, as in FIG. 4C, so that the transition point of a clocked inverter is between Vp0 and Vp1, as an output potential Vout, in response to data of "0"/"1," Low/High (or High/Low) is output, and reading can be performed.

For example, the differential amplifier is operated at Vdd=3 V, and Vy, V0, and Vref are set so that Vy=0 V; V0=3 V, and Vref=1.5 V. If R0/Rr=Rr/R1=9, in the case where the memory cell has the data "0", the Vp0 is 2.7 V and High is output as the Vout, while in the case where the memory cell has the data "1", the Vp1 is 0.3 V and Low is output as the Vout. In this way, reading of the memory cell can be performed.

According to the above method, electric resistance of the layer 105 including an organic compound is read out by a voltage value by utilization of a difference in the resistance value and the resistance division. Note that the reading method is not limited to this method. For example, reading may be conducted by utilizing the difference in a current value other than the method utilizing the difference in electric resistance. In the case where electric characteristics of the memory cell have different diode characteristics in threshold voltages between the states of data "0" and data "1", reading may be carried out by using difference in the threshold voltage.

Consequently, change with time in the data storage characteristic of the memory element can be suppressed, and a memory device with a highly reliable storage function can be manufactured. Further, the element layer and the sealing layer are provided over the flexible substrate, whereby an extremely thin and flexible memory device with high reliability in retention for storing data can be manufactured.

Embodiment Mode 2

Figure 5:
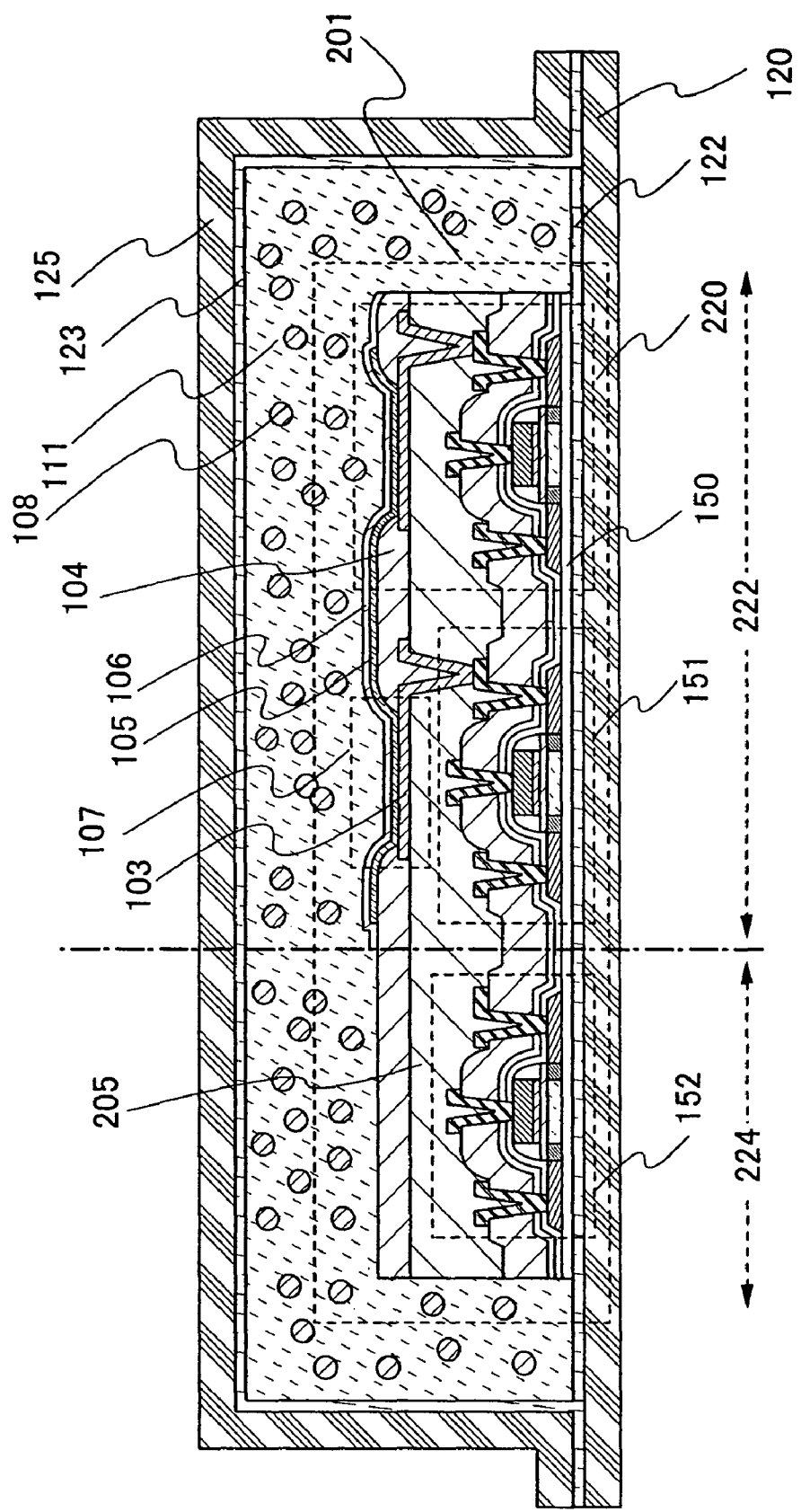
FIG. 5 is a cross sectional view illustrating a structure of a memory device of the present invention.

In this embodiment mode, in the memory device shown in the above embodiment mode, a main structure of a memory device having a memory cell array where memory cells each have a switching element and a memory element will be explained using FIG. 5 and FIGS. 6A to 6C. FIG. 5 is a cross sectional view of the memory device in this embodiment mode, and FIGS. 6A to 6C illustrate a structure of the memory device in this embodiment mode.

Note that the mode shown in FIG. 5 is a deformed example of the mode shown in FIG. 2C, and a mode where the element layer and the sealing layer are sealed with the flexible substrate is shown. In the mode shown in FIG. 5, the switching element and the memory element is formed in the element layer of the memory device shown in FIG. 1, FIGS. 2A and 2B.

Figure 6A:
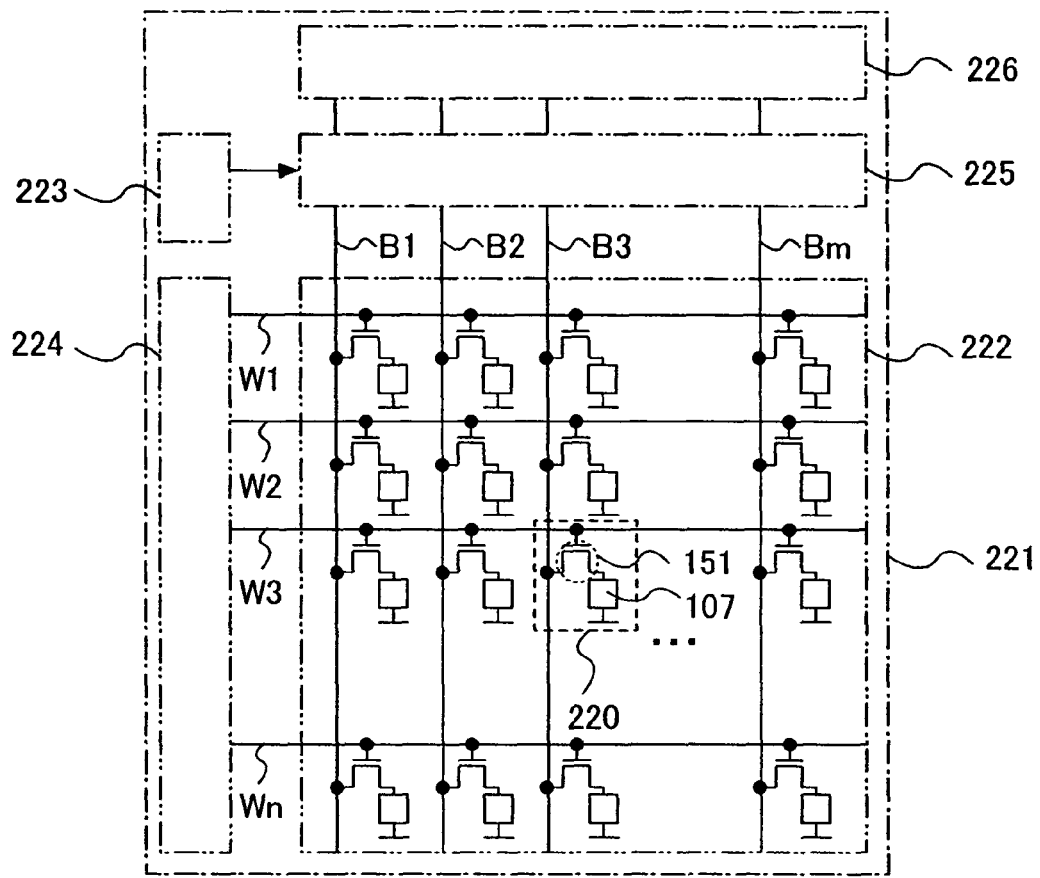
FIGS. 6A to 6C illustrate a structure of a memory device of the present invention.
Figure 6B:
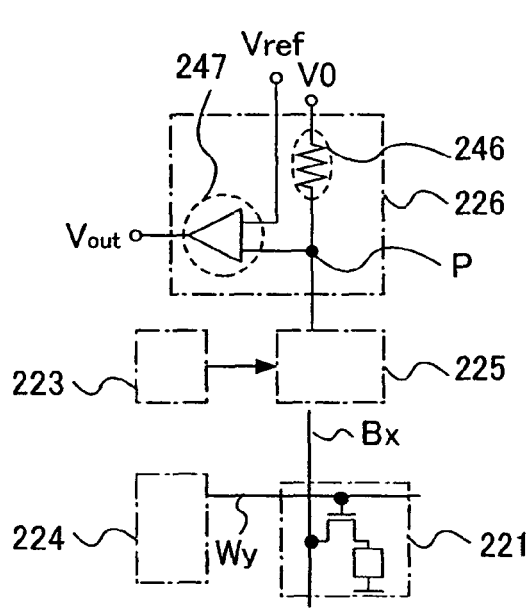
Figure 6C:
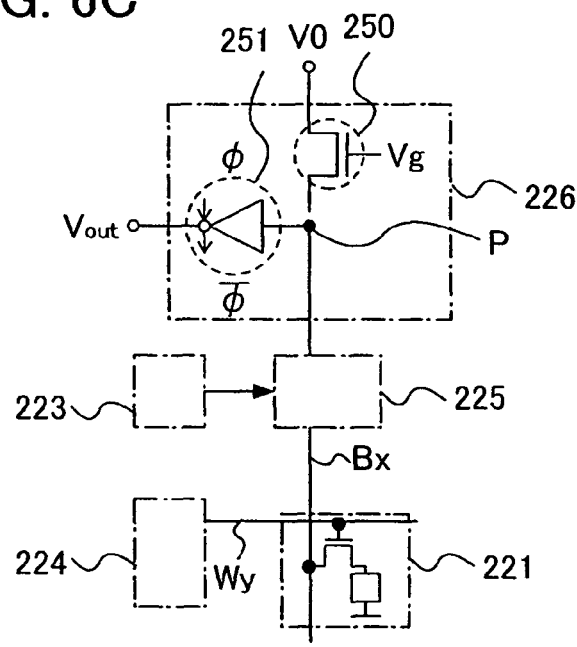

As shown in FIG. 6A, a memory device 221 in this embodiment mode has a memory cell array 222 and a driver circuit which drives the memory cell array 222. The memory cell array 222 has a plurality of memory cells 220 which are provided in matrix. As shown in FIG. 6A and FIG. 5, in the memory device 221, transistors which form the driver circuit (e.g., a transistor 152 which forms a decoder 224, a transistor 151 which functions as the switching element), and the memory element 107 connected to the transistor 151 are formed over the insulating layer 150 which functions as a base film. The memory element 107 has the first electrode layer 103 which is formed over the insulating layer 205, the layer 105 including an organic compound, and the second electrode layer 106. Note that the layer 105 including an organic compound is formed over the first electrode layer 103 and the insulating layer 104 which functions as a partition wall covering a part of the first electrode layer 103. Further, as the transistor 151, a thin film transistor is used. The memory device 221 may have an insulating layer (not shown) which functions as a protection layer covering the second electrode layer 106.

The sealing layer 111 containing the moisture absorbing material 108 is formed so as to cover a stacked body from the insulating layer 150 which functions as a base film to the second electrode layer 106. Here, the stacked body covered with the sealing layer 111 is referred to as an element layer 201.

The element layer 201 and the sealing layer 111 are sealed with the flexible substrates 120 and 125. The flexible substrate 120 is attached to the element layer 201 and the sealing layer 111 with the adhesive 122. The flexible substrate 125 is attached to the sealing layer 111 with the adhesive 123.

The moisture absorbing material 108 is contained in the sealing layer 111, whereby water which is absorbed by the sealing layer 111 can be absorbed and/or adsorbed by the moisture absorbing material 108. Therefore, water contained in an outside air of the memory device can be prevented from entering the element layer 201 where the first electrode layer, the second electrode layer, the layer including the organic compound and the like, are formed, which leads to prevention of them from deteriorating.

As the transistors 151 and 152, a MOS transistor using a silicon wafer, a MOS transistor using an SOI substrate, a thin film transistor, an organic semiconductor transistor, or the like, can be as appropriate used. Here, as the transistors 151 and 152, thin film transistors are used. In this embodiment mode, top gate thin film transistors are used as the thin film transistors; however the present invention is not limited to this structure. Bottom gate thin film transistors can also be used.

The memory element 107 is formed over the insulating layer 205. In this way, the use of the insulating layer 205 allows the first electrode 103 to be placed in an arbitrary position. That is, the memory element 107 can be formed over the transistor 151. As a result, the memory device can be more highly integrated.

The insulating layer 205 can be formed by using the same material and the same method as the insulating layer 104.

As a flexible substrate which is attached to the element layer 201 and the sealing layer 111, a flexible substrate like the flexible substrate 120 shown in embodiment mode 1, a film having a thermoplastic resin, paper made of a fibrous material, a ceramic sheet, or the like, is used, whereby reduction in size, thickness, and weight of the memory device can be achieved.

Next, data writing operations and data reading operations of a memory device described in this embodiment mode will be explained using FIGS. 6A to 6C.

The memory cell 220 has the first electrode layer which is connected to a word line Wy ($1 \leq y \leq n$), the second electrode layer which is connected to a bit line Bx ($1 \leq x \leq m$), the transistor 151, and the memory element 107. The memory element 107 has a structure where the layer including an organic compound is interposed between a pair of conductive layers. A gate electrode of the transistor 151 is connected to the word line, one of a source electrode or a drain electrode of the transistor 151 is connected to the bit line, the other of the source electrode and the drain electrode thereof is connected to the first electrode layer included in the memory element 107. The second electrode layer of the memory element is connected to a connecting terminal. The connecting terminal is connected to a common electrode (a potential of Vcom).

Next, an operation in writing data in the memory cell array 222 will be described.

Here, a case will be explained in which data is written to the third-row, third-column memory cell 220 by electric action. Note that the writing is performed by changing electrical characteristics of a memory cell; and an initial state (a state in which electric action is not applied) of the memory cell is denoted by data "0", while the state in which the electrical characteristics are changed is denoted by data "1"

When data of "1" is written to the memory cell 220, first, the memory cell 220 is selected by the decoders 223 and 224 and the selector 225. Specifically, by the decoder 224, a given voltage V22 is applied to a word line W3 connected to the memory cell 220. In addition, a bit line B3 connected to the memory cell 220 is connected to a reading/writing circuit 226 by the decoder 223 and the selector 225. A writing voltage V21 is output to the bit line B3 from the reading/writing circuit 226.

Thus, a transistor 151 that forms the memory cell is turned on and the memory element 107 is electrically connected to the bit line, and then a voltage of approximately Vw=Vcom−V21 is applied. Note that the second electrode layer of the memory element 107 is connected to the common electrode with the potential Vcom. By properly selecting the potential Vw, characteristics of the layer 105 including the organic compound provided between the conductive layers is physically or electrically changed, and writing of data of "1" is performed. Specifically, the writing voltage is set at a voltage that the electric resistance, at a reading operation voltage, between the first electrode layer and the second electrode layer in a state of data of "1" is changed so that the electric resistance is much smaller than the resistance in a state of data of "0". Thus, writing may be conducted by performing a short circuit between the first electrode layer and the second electrode layer. The potential is selected appropriately within the range of (V21, V22, Vcom)=(5 to 15 V, 5 to 15 V, 0 V) or (−12 to 0 V, −12 to 0 V, 3 to 5 V). The voltage Vw can be set in the range of 5 to 15 V or −5 to −15 V.

Note that writing is controlled so that data of "1" is not written in a memory cell connected to a non-selected word line or a non-selected bit line. Specifically, a potential (e.g., 0 V) by which transistors of memory cells connected to the non-selected word lines are made in an OFF state, may be applied to the non-selected word lines whereas the non-selected bit lines may be made in a floating state or applied with a potential which is the same level as Vcom.

On the other hand, when data "0" is written to the memory cell 220, electric action need not be applied to the memory cell 220. In circuit operation, for example, in a similar manner to the case of writing the data "1", the memory cell 220 is selected by the decoders 223 and 224, and the selector 225; however, an output potential, which is the same level as Vcom, is applied to the bit line B3 from the reading/writing circuit 226, or the bit line B3 is made in a floating state. As a result, low voltage (e.g., −5 to 5 V) is applied to the memory element 107, or no voltage is applied to the memory element 107, and therefore, an electric characteristic of the memory element is not changed and writing of the data "0" can be realized.

Next, an operation in reading out data by electric action will be described. The data reading is carried out by utilizing the fact that a memory element having a data "0" and a memory element having a data "1" have different electric characteristics. Here, electric resistance of the memory element included in the memory cell having the data "0" is denoted by R0 at a reading voltage and electric resistance of the memory element included in the memory cell having data "1" is denoted by R1 at the reading voltage, and a method for reading out data by utilizing a difference in electric resistance will be described as an example. Note that R1<<R0. As a composition of a reading portion of the reading/writing circuit, for example, the reading/writing circuit 226 including a resistor element 246 and a differential amplifier 247 shown in FIG. 6B can be given. The resistor element 246 has a resistance value Rr, wherein R1<Rr<R0. A transistor 250 may be used as a substitute for the resistor element 246, or a clocked inverter 251 can be used as a substitute for the differential amplifier (FIG. 6C). Note that the circuit structure is not limited to those structures shown in FIGS. 6B and 6C.

When reading of data from the third-row, third-column memory cell 220 is performed, first, the memory cell 220 is selected by the decoders 223 and 224 and the selector 225. Specifically, a given voltage V24 is applied by the decoder 224 to a word line W3 connected to the memory cell 220, and the transistor 151 is turned on. The bit line B3 connected to the memory cell 220 is connected to the terminal P of the reading/writing circuit 226 by the decoder 223 and the selector 225. As a result, the potential Vp of the terminal P is a value determined by resistance division of Vcom and V0 by the resistor element 246 (resistance value: Rr) and the memory element 107 (resistance value: R0 or R1). Consequently, when, the memory cell 220 has data "0," the value for Vp0 becomes Vp0=Vcom+(V0−Vcom)×R0/(R0+Rr). Additionally, when the memory cell 220 has data "1," the value for Vp1 becomes Vp1=Vcom+(V0−Vcom)×R1/(R1+Rr). As a result, as in FIG. 6B, so that Vref is between Vp0 and Vp1, and, as in FIG. 6C, so that the transition point of a clocked inverter is between Vp0 and Vp1, as an output potential Vout, in response to data "0"/"1," Low/High (or High/Low) is output, and reading can be performed.

For example, a differential amplifier is set to operate at Vdd=3 V, and Vcom, V0, and Vref are set so that Vcom=0 V, V0=3 V, and Vref=1.5 V. Supposing that R0/Rr=Rr/R1=9, supporting that the on resistance of the transistor 151 can be ignored, when data of the memory cell is "0," Vp0 becomes Vp0=2.7 V, and Vout is output as High; when data of the memory cell is "1," Vp1 becomes Vp1=0.3 V, and Vout is output as Low. In this way, reading of the memory cell can be performed.

According to the above method, reading is conducted with a voltage by utilizing a difference in the resistance value of the memory element 107 and resistance division. Note that the reading method is not limited to this method. For example, other than using the difference in electric resistance, reading may be conducted by using the difference in a current value. Alternatively, in the case where the electric characteristic of the memory cell has a diode characteristic in which threshold voltage varies between the data "0" and "1," the difference in the threshold voltages may be used for reading.

Consequently, change with time in the memory storage characteristic of the memory element can be suppressed, and a memory device with a highly reliable storage function can be manufactured. Further, the element layer and the sealing layer are provided over the flexible substrate, whereby an extremely thin and flexible memory device with high reliability in retention for storing data can be manufactured.

Embodiment Mode 3

Figure 7:
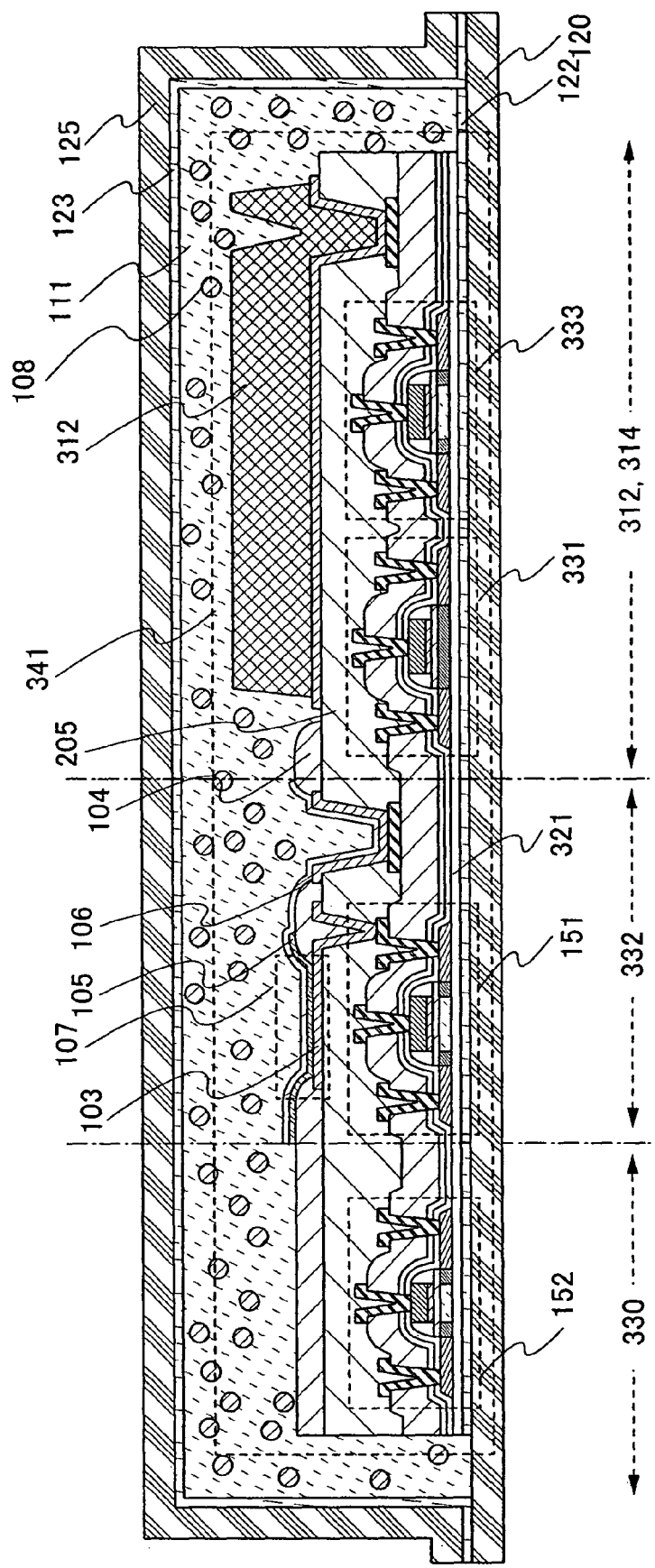
FIG. 7 is a cross sectional view illustrating a structure of a semiconductor device of the present invention.
Figure 8:
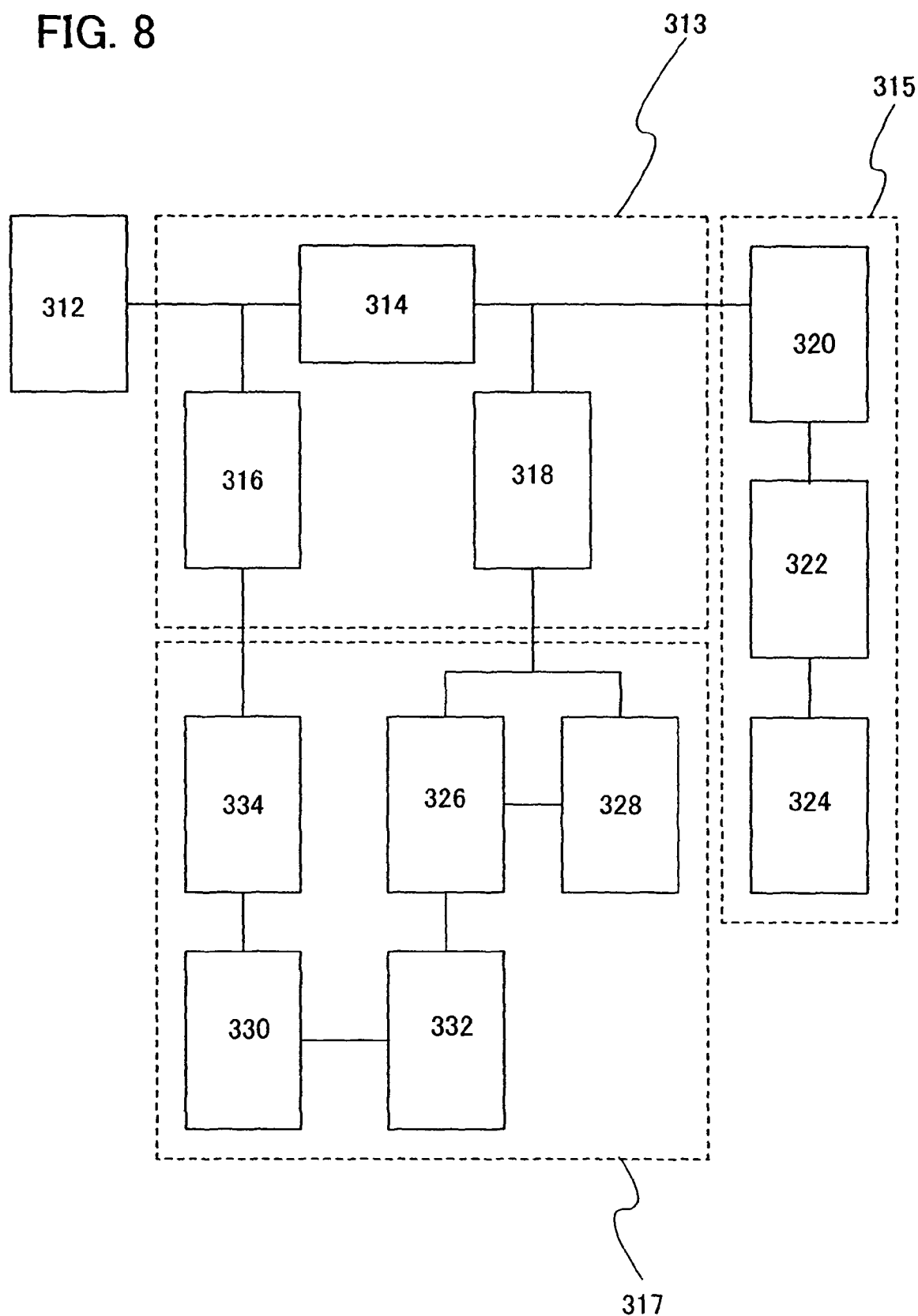
FIG. 8 illustrates a structure of a semiconductor device of the present invention.

In this embodiment mode, one mode of a semiconductor device which is formed by the peeling method shown in the above embodiment mode will be described below. Typically, a main structure of a semiconductor device which can perform transmission/reception of instructions or data with radio signals will be explained with reference to FIG. 7 and FIG. 8. FIG. 7 is a cross sectional view of the semiconductor device in this embodiment mode. FIG. 8 illustrates a structure of the semiconductor device in this embodiment mode. Note that the semiconductor device in this embodiment mode has a memory portion including the memory cell array shown in the above embodiment mode.

FIG. 8 is a block diagram illustrating a structural example of the semiconductor device which can perform transmission/reception of instructions or data with radio signals. Such a semiconductor device includes an antenna 312, an RF circuit portion 313, a power supply circuit portion 315, and a logic circuit portion 317 as elements. The antenna 312 transmits and receives signals to/from a communication device which is also called a reader/writer. As frequency band of carrier waves for delivering signals, a long wave band (30 kHz to 135 kHz), a short wave band (6.78 MHz, 13.56 MHz, 27.125 MHz, 40.68 MHz, or 5.0 MHz), a microwave band (2.45 GHz, 5.8 GHz, or 24.125 GHz), or the like, can be applied. The antenna 312 can have a coiled shape, monopole shape, or dipole shape depending on the communication frequency band.

Carrier waves that are received by the antenna 312 are divided into the power supply circuit portion 315 and the logic circuit portion 317 through a detection capacitor portion 314. In the power supply circuit portion 315, the carrier waves are half-wave rectified by a rectifier circuit portion 320, and then charged in a storage capacitor portion 322. A constant voltage circuit portion 324 outputs a constant voltage even if power of a certain level or more is supplied by the carrier waves received, and supplies power which is necessary to operate the logic circuit portion 317 or the like in the semiconductor device.

A demodulation circuit portion 318 in the RF circuit portion 313 demodulates the carrier waves to generate clock signals that are necessary to operate the logic circuit portion 317, and outputs the clock signals to a PLL circuit portion 328 which has a function of correcting the clock signals and to a code recognition/judgment circuit portion 326. For example, the demodulation circuit portion 318 detects an amplitude fluctuation as reception data of "0" or "1" based on a reception signal to which an Amplitude Shift Keying (ASK) is performed. The demodulation circuit portion 318 includes a low-pass filter, for example. In addition, a modulation circuit portion 316 transmits transmission data as a transmission signal to which ASK is performed.

The code recognition/judgment circuit portion 326 recognizes and judges instruction codes. Instruction codes that are recognized and judged by the code recognition/judgment circuit portion 326 include an EOF signal (End Of Frame), an SOF signal (Start Of Frame), a flag, a command code, a mask length, a mask value, or the like. The code recognition/judgment circuit portion 326 also includes a cyclic redundancy check (CRC) function for detecting transmission errors. A judgment result by the code recognition/judgment circuit portion 326 is output to a memory controller portion 330. The memory controller portion 330 controls data reading from a memory portion 332 based on the judgment result. Data which is read out from the memory portion 332 is encoded by an encoding circuit portion 334, and is modulated by the modulation circuit portion 316. Then a response signal is generated.

As a structure of the memory portion 332, a memory cell having the memory element as shown in embodiment mode 1 or a memory cell having the memory element connected to the switching element as shown in embodiment mode 2 can be appropriately used. Further, as well as the memory cell as shown in the above embodiment mode, the memory portion 332 can additionally include a mask ROM (Read Only Memory) which stores only fixed data, a memory such as an SRAM (Static Random Access Memory) from/to which data can be read and written at arbitrary timing, a nonvolatile memory which has a floating electrode for accumulating electric charges, or the like.

As shown above, the semiconductor device shown in FIG. 8 has a function of writing data or reading data to/from the memory portion 332 by receiving instructions from a communication device which is also called a reader/writer.

Next, a cross-sectional structure of a semiconductor device in this embodiment mode will be explained with reference to FIG. 7.

Note that the mode illustrated in FIG. 7 is a deformed example of the mode illustrated in FIG. 2C, and the mode where the element layer and the sealing layer are sealed with the flexible substrate is illustrated. In this embodiment, the memory device, the antenna, the semiconductor element, or the like shown in the following embodiment mode are formed in the element layer of the memory device shown in FIG. 1, FIGS. 2A and 2B.

Here, as a part of the semiconductor device, a cross-sectional view of the memory controller portion 330, the memory portion 332, the antenna 312 and the detection capacitor portion 314 is illustrated (see FIG. 7). Typically, the transistor 152 which is included in the memory controller portion 330, the transistor 151 and the memory element 107 connected to the transistor 151 which are included in the memory portion 332, and a capacitor 331, a thin film transistor 333 and the antenna 312 of the detection capacitor portion 314, which are formed over an insulating layer 321 functioning as a base film, are illustrated. Note that, although not shown here, the antenna 312 and the thin film transistor 333 are electrically connected to each other.

The memory element 107 has the first electrode layer 103, the layer 105 including an organic compound and the second electrode layer 106 which are formed over the insulating layer 205. The second electrode layer 106 is formed of a tin alloy layer. Note that the layer 105 including an organic compound is formed over the first electrode layer 103 and the insulating layer 104 which functions as a partition wall covering a part of the first electrode layer 103. The transistor 151 which functions as a switching element is formed using a thin film transistor. An insulating layer (not shown) which functions as a protection layer covering the second electrode layer 106 and the antenna 312 may be provided to the semiconductor device. Note that a stacked body from the insulating layer 150 functioning as a base film to the antenna 312 is referred to as an element layer 341.

Further, the sealing layer 111 containing the moisture absorbing material 108 is formed so as to cover the element layer 341.

The moisture absorbing material 108 is contained in the sealing layer 111, whereby water which is absorbed by the sealing layer 111 can be absorbed and/or adsorbed by the moisture absorbing material 108. Therefore, water contained in an outside air of the semiconductor device can be prevented from entering the element layer 341 where the first electrode layer, the second electrode layer, the layer including an organic compound, and the like, are formed, which can prevent them from deteriorating.

The element layer 341 and the sealing layer 111 are sealed with the flexible substrates 120 and 125. The flexible substrate 120 is attached to the element layer 341 and the sealing layer 111 with the adhesive 122. The flexible substrate 125 is attached to the sealing layer 111 with the adhesive 123.

According to this embodiment mode, change with time in the memory storage characteristic of the memory element can be suppressed, data can be transmitted and received wirelessly, and a semiconductor device with a highly reliable storage function can be manufactured. Further, the element layer and the sealing layer are provided over the flexible substrate, whereby an extremely thin and flexible semiconductor device with high reliability in retention for storing data where data can be transmitted and received wirelessly can be manufactured.

Embodiment 1

In this embodiment, a method for manufacturing a semiconductor device having a memory cell array where memory elements connected to switching elements are provided in matrix in a semiconductor device which can perform transmission/reception of instructions or data with radio signals will be described below with reference to FIG. 9A to FIG. 15F.

A peeling layer 502 is formed over a substrate 501. As the substrate 501, a glass substrate can be used. The peeling layer 502 has a stacked layer structure of a metal layer and a metal oxide layer. As the metal layer, a tungsten layer, a nitride tungsten layer or a molybdenum layer with a thickness of 30 nm to 200 nm which is fabricated by a sputtering method is used.

Next, the metal oxide layer is formed by oxidation of the surface of the metal layer. The metal oxide layer may be formed by oxidation of the surface with the use of pure water containing oxygen or ozone water or with the use of oxygen plasma. Alternatively, the metal oxide layer may be formed by heating in an atmosphere including oxygen. Further alternatively, the metal oxide layer may be formed in a later step of forming an insulating layer. In this case, when a silicon oxide layer or a silicon oxynitride layer is prepared as the insulating layer by a plasma CVD method, the surface of the peeling layer 502 was oxidized, leading to the formation of the metal oxide layer.

Next, a first insulating layer 503 is formed over the metal oxide layer. As the first insulating layer 503, an insulating layer such as a silicon oxide layer, a silicon nitride layer or silicon oxynitride layer can be used. As a typical example of the first insulating layer 503, a two-layer stacked structure of a silicon nitride oxide layer formed with a thickness of 50 nm to 100 nm by a PCVD method using $SiH_4$, $NH_3$, and $N_2O$ as reactive gases and a silicon oxynitride layer formed with a thickness of 100 nm to 150 nm using $SiH_4$ and $N_2O$ as reactive gases can be employed. One layer in the first insulating layer 503 is preferably a silicon nitride layer or a silicon oxynitride layer with a thickness of 10 nm or less. Alternatively, the first insulating layer 503 may have a three-layer structure where a silicon nitride oxide layer, a silicon oxynitride layer and a silicon nitride layer are sequentially stacked. Although an example is given here in which the first insulating layer 503 is formed as a base insulating film, the first insulating layer 503 may be omitted if not necessary.

Next, a semiconductor layer is formed over the first insulating layer 503. The semiconductor layer can be formed as follows: a semiconductor layer having an amorphous structure is formed by a sputtering method, a LPCVD method, a plasma CVD method, or the like and is crystallized by a crystallization treatment (e.g., laser crystallization, thermal crystallization, or thermal crystallization using a catalyst such as nickel) to form a crystalline semiconductor layer; a resist mask is formed over the crystalline semiconductor layer using a first photomask; and the crystalline semiconductor layer is etched into a desired shape. Note that, by using a plasma CVD method, the first insulating layer and the semiconductor layer having an amorphous structure can be stacked continuously without being exposed to atmospheric air. This semiconductor layer is formed to have a thickness of 25 nm to 80 nm (preferably 30 nm to 70 nm). The material of the crystalline semiconductor layer is not limited; however, silicon, a silicon-germanium alloy, or the like, is preferably used.

Alternatively, for the crystallization of the semiconductor layer having an amorphous structure, a continuous wave laser may be used. In order to obtain a crystal with a large grain size in crystallization of an amorphous semiconductor layer, it is preferable to use a solid state laser capable of continuous wave oscillation and apply any of second to fourth harmonics of a fundamental wave. Typically, a second harmonic (532 nm) or a third harmonic (355 nm) of a Nd:YVO$_4$ laser (a fundamental wave: 1064 nm) can be applied. When a continuous wave laser is used, laser beam emitted from a continuous wave YVO$_4$ laser with output power of 10 W is converted into a harmonic by a non-linear optical element. The emission of a harmonic can be also achieved by putting a YVO$_4$ crystal and a non-linear optical element in a resonator. Then, the laser beam is preferably formed into a rectangular shape or an elliptical shape on an irradiated surface with an optical system to irradiate a subject. At this time, an energy density of about 0.01 to 100 MW/cm$^2$ (preferably 0.1 to 10 MW/cm$^2$) is required. Then, the semiconductor layer is irradiated with laser beam while being moved relatively to the laser beam at a speed of about 10 to 2000 cm/s.

Alternatively, as the crystallization treatment of a semiconductor layer having an amorphous structure, a sequential lateral solidification method (SLS method) may be used. In a SLS method, a sample is irradiated with pulsed excimer laser beam through a slit-shaped mask. This is a method for continuously forming a crystal by the artificially controlled super-lateral growth and can be conducted by performing crystallization displacing a relative position of the sample and the laser beam every shot by an approximately the same length to that of the crystal which is super-laterally grown.

Next, a very small amount of an impurity element (boron or phosphorus) is added to the semiconductor layer in order to control a threshold value of a thin film transistor, if necessary. Here, an ion doping method is applied, in which plasma-excited diborane (B$_2$H$_6$) is employed without separation by mass.

Next, a resist mask is formed, using a second photomask, over the semiconductor layer which functions as a capacitor electrode of a capacitor later, and then a low-concentration impurity region is formed by introduction of an impurity element. As the impurity element, an impurity element imparting n-type conductivity or an impurity element imparting p-type conductivity can be used. As the impurity element imparting n-type conductivity, phosphorus (P), arsenic (As), or the like, can be used. Here, phosphorus (P) is added to the semiconductor layer so as to be included at a concentration of $1\times10^{15}$ to $1\times10^{19}$/cm$^3$ to form the n-type impurity region.

Then, an oxide layer on the surface of the semiconductor layer is removed by using an etchant containing hydrofluoric acid, and at the same time, the surface of the semiconductor layer is cleaned.

Next, a second insulating layer which covers the semiconductor layer is formed. The second insulating layer is formed by a plasma CVD method or a sputtering method to have a thickness of 1 to 200 nm. The second insulating layer may be formed in a single-layer or stacked-layer structure with an insulating layer containing silicon, which is preferably as thin as 10 nm to 50 nm, and then surface nitriding treatment using plasma by a microwave is performed. The second insulating layer serves as a gate insulating layer of a thin film transistor to be formed later.

Next, gate electrodes 504 to 507 and a capacitor electrode 508 are formed over the second insulating layer. A conductive layer with a thickness of 100 to 500 nm is formed by a sputtering method, over which a resist mask is formed by using a third photomask. Then, the conductive layer is etched into a desired shape, resulting in the formation of the gate electrodes 504 to 507 and the capacitor electrode 508.

As a material of the gate electrodes 504 to 507 and the capacitor electrode 508, a material which can undergoes silicidation with silicon may be used, and an element selected from Ti, W, Ni, Cr, Mo, Ta, Co, Zr, V, Pd, Hf, Pt, and Fe, or an alloy or a compound containing the element as its main component may be formed as a single layer or a stacked layer. However, as a gate electrode of a thin film transistor, W or Mo of a high melting point metal is preferably used. In a case where the gate electrodes 504 to 507 and the capacitor electrode 508 are formed with a stacked layer, the material layer which serves as a lower layer may also be formed with a polycrystalline silicon layer doped with an impurity element such as phosphorus if the material layer which serves as an upper layer is formed of the above-described materials. Alternatively, the upper layer may be formed using the above-described material, and the lower layer may be formed using a nitride of the above-described material. At this time, the lower layer is formed with a metal nitride, which can prevent a metal in the upper layer from diffusing into the gate insulating layer or the underlying semiconductor layer.

Next, a resist mask is formed using a fourth photomask so as to cover the semiconductor layer in a region to be a p-channel thin film transistor, and a semiconductor layer in a region to be an n-channel thin film transistor is doped with an impurity element using the gate electrodes 505 to 507 as masks, thereby forming low-concentration impurity regions. Here, phosphorus (P) is added to the semiconductor layer in a region to be an n-channel thin film transistor at a concentration of $1\times10^{15}$ to $1\times10^{19}$/cm$^3$ to form an n-type impurity region.

Next, the resist mask is removed, another resist mask is formed using a fifth photomask so as to cover the semiconductor layer to be an n-channel thin film transistor, and the semiconductor layer in a region to be a p-channel thin film transistor is doped with an impurity element using the gate electrode 504 as a mask to form a p-type impurity region. As the p-type impurity element, boron (B), aluminum (Al), gallium (Ga), or the like, can be used. Here, boron (B) is added to the semiconductor layer in a region to be a p-channel thin film transistor at a concentration of $1\times10^{19}$/cm$^3$ to $1\times10^{20}$/cm$^3$ to form a p-type impurity region. As a result, source or drain regions 514 and 515 and a channel formation region 516 are formed in the semiconductor layer in a region to be a p-channel thin film transistor.

Next, sidewalls 510 are formed on both side surfaces of the gate electrodes 504 to 507 and the capacitor electrode 508. The sidewalls 510 is formed by forming a third insulating layer as a single layer or a stacked layer of a layer containing an inorganic material such as an oxide of silicon or nitride of silicon, or a layer containing an organic material such as an organic resin so that the second insulating layer, the gate electrodes 504 to 507 and the capacitor electrode 508 are covered. A plasma CVD method, a sputtering method or the like can be applied to form the third insulating layer. Then, the third insulating layer is selectively etched by anisotropic etching, which is conducted mainly in the perpendicular direction, resulting in the formation of the insulating layer (sidewalls 510) which is in contact with the side surfaces of the gate electrodes 504 to 507 and the capacitor electrode 508. Note that a part of the second insulating layer is also etched and removed at the same time when the sidewalls 510 is formed. Therefore, the gate insulating layers 512 are formed below the gate electrodes 504 to 507, the capacitor electrode 508, and the sidewalls 510.

Next, a resist mask is formed using a sixth photomask so as to cover the semiconductor layer to be a p-channel thin film transistor, and the semiconductor layer in a region to be an n-channel thin film transistor is doped with an impurity element using the gate electrodes 504 to 507, the capacitor electrode 508, and the sidewalls 510 as a mask, thereby forming a high-concentration impurity region. The resist mask is then removed after doping of the impurity element. Here, phosphorus (P) is added to the semiconductor layer in a region to be an n-channel thin film transistor at a concentration of $1 \times 10^{19}$ to $1 \times 10^{20}/cm^3$ to form an n-type high-concentration impurity region. As a result, source or drain regions 517 and 518, LDD regions 519 and 520, and a channel formation region 521 are formed in the semiconductor layer in a region to be an n-channel thin film transistor. The LDD regions 519 and 520 are formed below the sidewalls 510. Further, a low-concentration impurity region 511 and a high-concentration impurity region 513 are formed in the semiconductor layer to be the capacitor electrode of the capacitor.

A structure is shown where an LDD region is formed in the semiconductor layer included in the n-channel thin film transistor and where a LDD region is not formed in the semiconductor layer included in the p-channel thin film transistor; however, the present invention is not limited to this structure. A LDD region may be formed in each of the semiconductor layers of the n-channel thin film transistor and the p-channel thin film transistor.

Next, after formation of a fourth insulating layer 522 including hydrogen by a sputtering method, an LPCVD method, a plasma CVD method, or the like, activation treatment and hydrogenation treatment of the impurity element added into the semiconductor layer are performed. Activation treatment and hydrogenation treatment of the impurity element are performed by heat treatment using a furnace (heat treatment at 300 to 550° C. for 1 to 12 hours) or a rapid thermal annealing method (RTA method) using a lamp light source. For the fourth insulating layer 522 containing hydrogen, a silicon nitride oxide layer that is obtained by a PCVD method can be used. Here, a thickness of the fourth insulating layer 522 containing hydrogen is set to be 50 to 200 nm. In addition, when the semiconductor layer is crystallized using a metal element such as nickel which promotes crystallization, gettering for reducing the concentration of nickel in the channel formation region can also be performed at the same time as activation. Note that the fourth insulating layer 522 containing hydrogen is a first layer of an interlayer insulating layer.

Then, a fifth insulating layer 523 and a sixth insulating layer 524 are formed as a second layer and a third layer, respectively, of the interlayer insulating layer by a sputtering method, an LPCVD method, a plasma CVD method, or the like. As the fifth insulating layer 523 and the sixth insulating layer 524, an insulating layer such as a silicon oxide layer, a silicon nitride layer, a silicon oxynitride layer can be used with a single layer or a stacked layer. Here, the thickness of the fifth insulating layer 523 is set to be 50 to 200 nm, and the thickness of the sixth insulating layer 524 is set to be 300 to 800 nm.

A cross sectional view of the semiconductor device which is obtained through the steps up to here corresponds to FIG. 9A.

Next, a resist mask is formed using a ninth photomask. Then, the fourth insulating layer 522, the fifth insulating layer 523 and the sixth insulating layer 524 are selectively etched, and a contact hole that reaches the semiconductor layer and a contact hole that reaches the gate electrode are formed. Then, the resist mask is removed after etching.

Next, an oxide layer on the surface of the semiconductor layer which is exposed is removed by an etchant containing a hydrofluoric acid, and the surface of the semiconductor layer which is exposed to light is cleaned at the same time.

Next, a conductive layer is formed by a sputtering method This conductive layer is formed using a single layer or a stacked layer of an element selected from Ti, W, Ni, Cr, Mo, Ta, Co, Zr, V, Pd, Hf, Pt, Fe, Al, or Cu, or an alloy or a compound containing the element as its main component.

Next, a resist mask is formed using a tenth photomask, and the conductive layer is selectively etched to form source electrodes or drain electrodes 525 to 532, gate lead wirings 535 to 538, capacitor wirings 533, 534 and 539 of the capacitor, a lead wiring 541 for the second electrode of the memory element and a conductive layer 542. Note that, although not shown here, the conductive layer 542 is electrically connected to the antenna and the thin film transistor in the power supply circuit portion. After etching the conductive layer, the resist mask is removed.

A cross sectional view of the semiconductor device which experienced the steps up to here corresponds to FIG. 9B. In this embodiment, the thin film transistor in the logic circuit portion, the thin film transistor in the memory portion, the antenna, and the thin film transistor and the capacitor in the power supply circuit portion can be formed over the same substrate by using ten photomasks.

Next, a seventh insulating layer 540 is formed to cover the thin film transistor in the logic circuit portion 601, a thin film transistor in the memory portion 602, an antenna, and a thin film transistor and the capacitor in the power supply circuit portion 603. As the seventh insulating layer 540, an insulating layer including silicon oxide or an organic resin layer can be used. In an attempt to improve reliability of a wireless chip, an insulating layer including silicon oxide is preferably used. In a case where an antenna to be formed later is formed by a screen printing method, it is preferable that the antenna has a plane surface; therefore, the organic resin layer formed by a coating method is preferably used. A practitioner may choose appropriately whether the seventh insulating layer 540 is provided. Further, in this embodiment, an example is shown where the antenna to be formed later is overlapped with the driving circuit and the memory portion; therefore, the seventh insulating layer 540 serves as an interlayer insulating layer which insulates the antenna from the power supply circuit portion 603 and/or the logic circuit portion. In a case where the antenna is formed to have a circular shape (for example, a loop antenna) or a spiral shape, one of the both ends of the antenna is led with a wiring of a lower layer; therefore, the seventh insulating layer 540 is preferably provided. However, in a case where the antenna is formed to have a linear shape (for example, a dipole antenna), a flat shape (such as a patch antenna), or the like, by applying a microwave method, the antenna to be formed later can be placed so as not to overlap with the driving circuit and the memory portion; therefore, the seventh insulating layer 540 is not required to be provided.

Next, a resist mask is formed using an eleventh photomask, and the seventh insulating layer 540 is selectively etched to form an opening which reaches the lead wiring 541 and an opening which reached the conductive layer 542. Then, the resist mask is removed after etching.

Next, a metal layer is formed over the seventh insulating layer 540. As the metal layer, a single layer or a stack layer selected from Ti, Ni and Au can be used. Then, a resist mask is formed using a twelfth photomask, and the metal layer is selectively etched to form a first electrode layer 543 of the memory element, a conductive layer 544 to be connected to the lead wiring 541 and a base film 545 of the antenna. Note that the first electrode layer 543, the conductive layer 544 and the base film 545 here can also be selectively formed by a sputtering method using a metal mask without using a resist mask. By providing the base film 545 of the antenna, a large contact area with the antenna can be secured. Alternatively, the conductive layer 544 and the lead wiring 541 may not be formed, depending on a layout of a circuit design.

A cross sectional view of the semiconductor device obtained through the steps up to here corresponds to FIG. 9C.

Next, an eighth insulating layer 548 is formed so as to cover the first electrode layer 543, the conductive layer 544, the base film 545 of the antenna, and the seventh insulating layer 540. The eighth insulating layer can be formed of a similar material to the seventh insulating layer 540. Here, photosensitive polyimide with a thickness of 0.8 to 1.5 μm is applied, and the photosensitive polyimide is exposed to light and developed using a thirteenth photomask. Then the photosensitive polyimide is heated at 200 to 350° C. to form the eighth insulating layer 548.

Next, an antenna 546 is formed over the base film 545. The antenna 546 can be formed by a method in which a metal layer such as Al or Ag is formed by a sputtering method, a resist mask is formed using a photomask and etching is performed using the resist mask. Alternatively, the antenna 546 may be formed by a screen printing method. If a reduction in the number of photomasks is prioritized, the antenna may be formed by a screen printing method. Here, after printing using a silver paste, baking is performed at 200 to 350° C. to form the antenna 546 with a thickness of 5 to 20 μm.

Figure 10A:
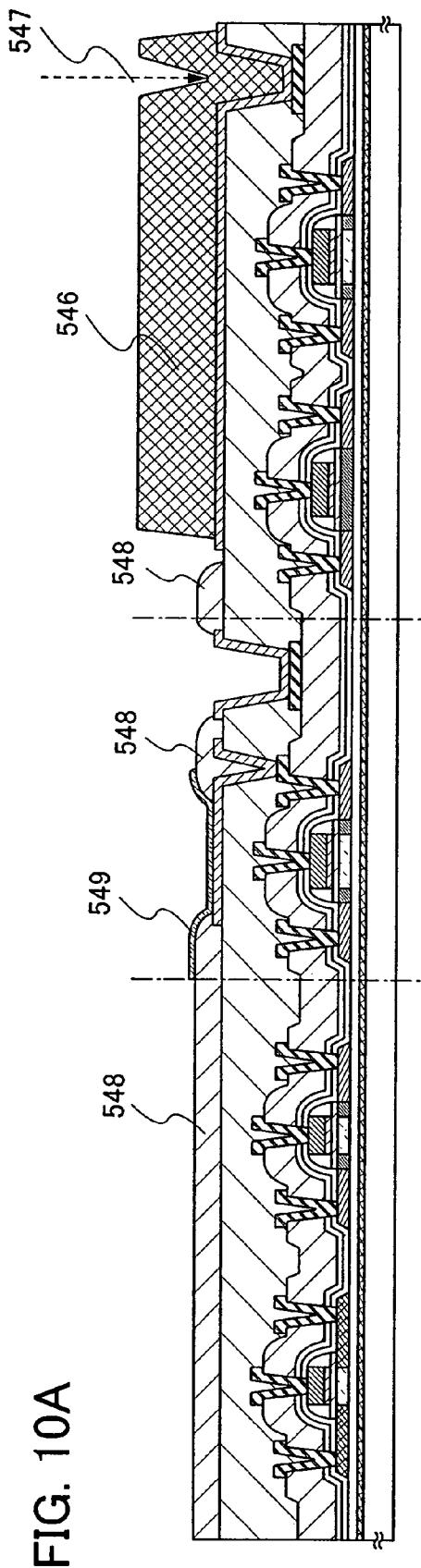
FIGS. 10A and 10B are cross sectional views illustrating a manufacturing step of a semiconductor device of the present invention.

Next, a layer 549 including an organic compound is formed over a part of the first electrode layer 543 and the eighth insulating layer 548. The layer 549 including an organic compound can be formed by using appropriately an evaporation method, a coating method, a droplet discharge method, a printing method or the like. Here, a calcium fluoride layer with a thickness of 1 to 4 nm is formed by an evaporation method, and then CzPA is evaporated to form the layer 549 including an organic compound with a thickness of 5 to 20 nm. As shown in FIG. 10A, a region where the base film 547 is overlaid with the antenna 546 may be irradiated with laser beam 547 after the formation of the antenna 546 or the layer 549 including an organic compound. This irradiation process enhances the adhesion between the antenna 546 and the base film 545, which contributes to the reduction in the contact resistance therebetween.

A cross sectional view of the semiconductor device obtained through the steps up to here corresponds to FIG. 10A.

Next, a second electrode 550 of the memory element is formed over a part of the layer 549 including an organic compound, the conductive layer 544 and the eighth insulating layer 548. The second electrode 550 is also connected to the conductive layer 544. The second electrode 550 can be formed by using appropriately an evaporation method, a sputtering method, a coating method, a droplet discharge method, a printing method, or the like. Here, an alloy layer of tin and silver with a thickness of 50 to 200 nm is formed by an evaporation method to form the second electrode 550.

Figure 10B:
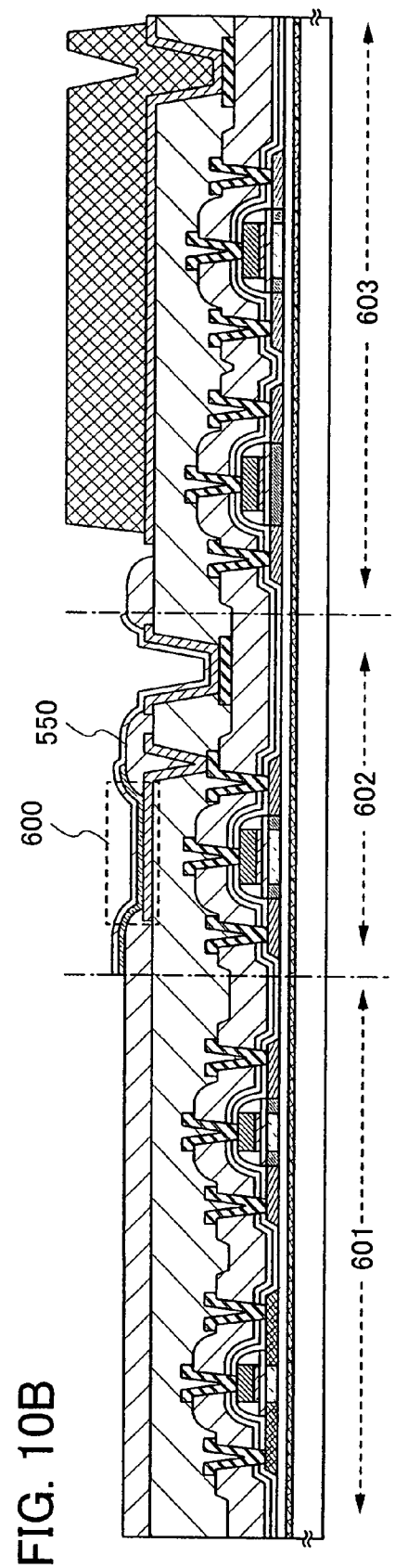

A cross sectional view of the semiconductor device obtained through the steps up to here corresponds to FIG. 10B. In this embodiment, the thin film transistor in the logic circuit portion 601, the thin film transistor and a memory element 600 in the memory portion 602, the antenna, and the thin film transistor in the power supply circuit portion 603 can be formed over the same substrate.

Further, in this embodiment, although the example including forming steps of a resist mask using a photomask is given here, the present invention is not limited thereto, and a resist material may also be selectively formed by a droplet discharge method without using a photomask to form a resist mask.

Next, a ninth insulating layer 551 including moisture absorbing materials 555 is formed so as to cover the eighth insulating layer 548, the second electrode 550 and the antenna 546. As the ninth insulating layer 551, a sealing layer which has a function of preventing water or the like contained in an outside air from entering the element layer is formed. Here, as the moisture absorbing material 555, a fine particle of calcium oxide having an average grain diameter of 40 μm is used, and as the ninth insulating layer 551, an epoxy resin containing calcium oxide is printed by a printing method and baked at 160° C. for 30 minutes to form an epoxy resin layer with a thickness of 10 to 30 μm. Note that a stacked body from the first insulating layer to the second electrode is referred to as an element layer 554. The ninth insulating layer 551 functions as a sealing layer which seals the element layer 554.

Next, in order to perform the later peeling step easily, irradiation with a laser beam 213 is performed to form a groove (not shown).

Next, a supporting member 552 is provided over the ninth insulating layer 551. Here, as the supporting member 552, a film having an adhesive layer 553 is attached to the ninth insulating layer 551.

Figure 14A:
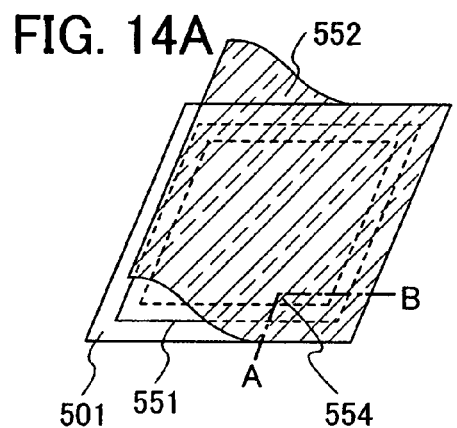
FIGS. 14A to 14H are perspective views and cross sectional views illustrating a manufacturing step of a semiconductor device of the present invention.
Figure 14B:
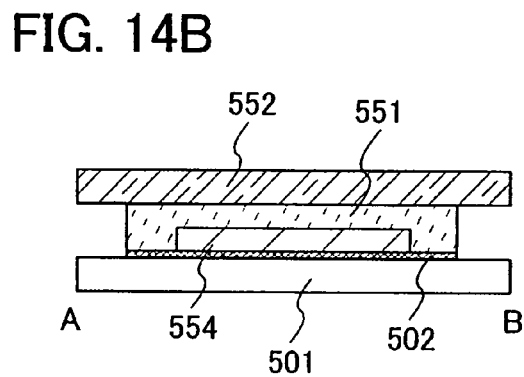

A cross sectional view of the semiconductor device obtained through the steps up to here corresponds to FIG. 11A, and a perspective view of the semiconductor device corresponds to FIG. 14A. In addition, a cross sectional view taken along a line A-B in FIG. 14A corresponds to FIG. 14B.

Next, the element layer and the sealing layer are peeled off the substrate 501. Specifically, the element layer 554 and the insulating layer 551 are peeled off the substrate 501 at the peeling layer 502 by the physical method. The physical method refers to a dynamic method or a mechanical method, which provides some dynamic energy (mechanical energy) to the semiconductor device. The typical physical method refers to mechanical power addition (for example, peeling by a human hand or a gripper or separation treatment by rotating a roller). Here, a roller 561 having adhesiveness is attached to a surface of the supporting member 552, and the roller 561 is rotated whereby the element layer 554 and the insulating layer 551 are peeled off the substrate 501. Specifically, peeling is caused in the metal oxide layer, at the interface between the first insulating layer 503 and the peeling layer 502, or in the peeling layer 502, and thus the element layer 554 and the insulating layer 551 can be peeled off the substrate 501 by relatively small power.

Figure 14C:
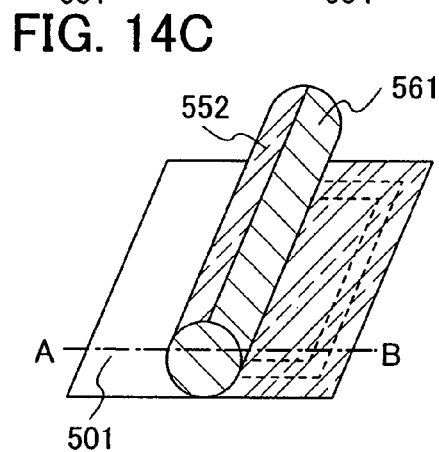
Figure 14D:
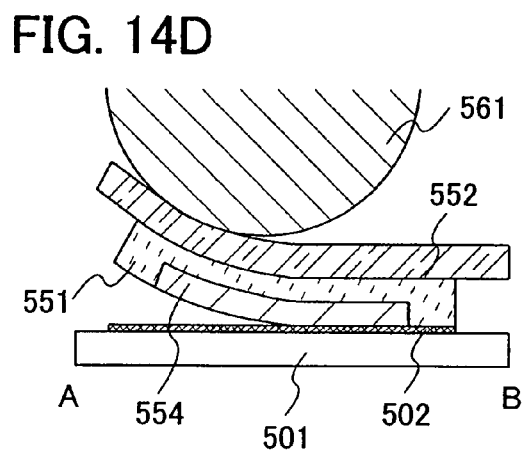

A cross sectional view of the semiconductor device obtained through the steps up to here corresponds to FIG. 11B, and a perspective view of the semiconductor device corresponds to FIG. 14C. In addition, a cross sectional view taken along a line A-B in FIG. 14C corresponds to FIG. 14D.

Next, a first flexible substrate is attached to the element layer 554 and the insulating layer 551 which are peeled off the peeling layer. Here, the first flexible substrate 562 is attached to the surfaces of the element layer 554 and the insulating layer 551 by using an adhesive 563.

As the first flexible substrate 562, the flexible substrate 120 shown in embodiment mode 1 can be appropriately used. Further, paper, prepreg, ceramic sheet, or the like, can be used. As the adhesive 563, various curable adhesives such as a reactive curable adhesive, a thermal curable adhesive, a photo curable adhesive such as an ultraviolet curable adhesive, and an anaerobic adhesive can be used.

Figure 12A:
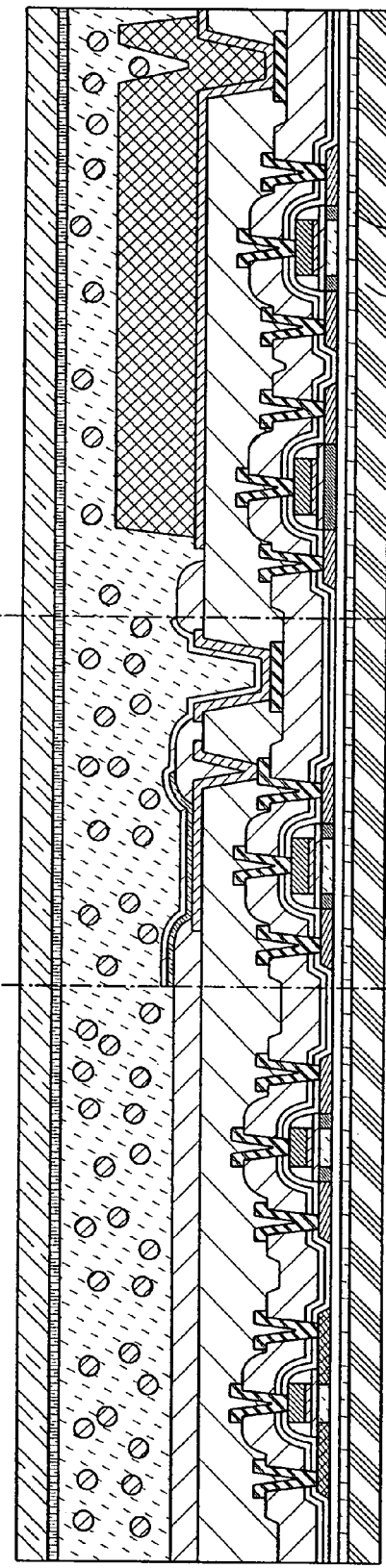
FIGS. 12A and 12B are cross sectional views illustrating a manufacturing step of a semiconductor device of the present invention.
Figure 14E:
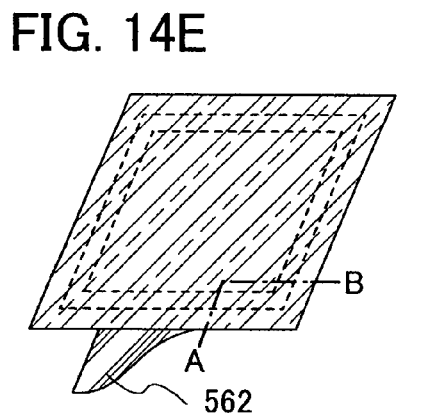
Figure 14F:
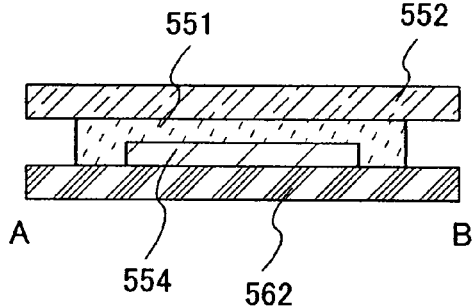

A cross sectional view of the semiconductor device obtained through the steps up to here corresponds to FIG. 12A, and a perspective view of the semiconductor device corresponds to FIG. 14E. In addition, a cross sectional view taken along a line A-B in FIG. 14E corresponds to FIG. 14F.

Figure 14G:
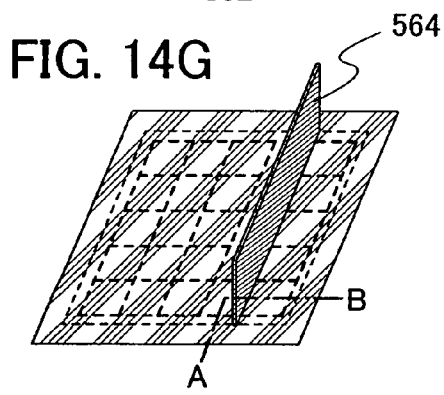
Figure 14H:
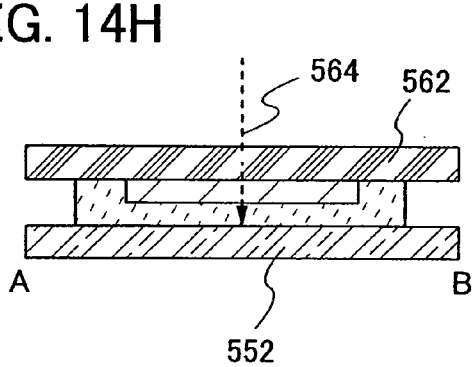

Next, as shown in FIGS. 14G and 14H, the semiconductor device is turned upside down so that the first flexible substrate 562 is at an upper side and the supporting member 552 is at a lower side, and the first flexible substrate 562, the element layer 554 and the insulating layer 551 are cut by a cutting means 564, and then the semiconductor device is divided into plural individual thin film integrated circuits. As the cutting means 564, a laser cutting method, a dicing method, a scribing method, or the like, can be used as appropriate. Here, the supporting member 552 is not divided, and the first flexible substrate 562, the insulating layer 551 and the element layer 554 are cut by a cutter to be divided.

Figure 15A:
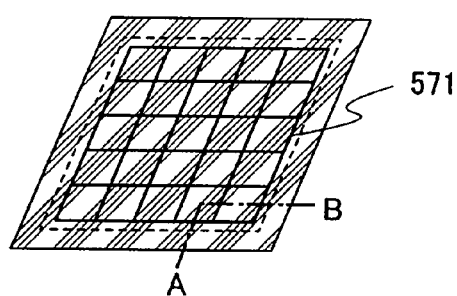
FIGS. 15A to 15F are perspective views and cross sectional views illustrating a manufacturing step of a semiconductor device of the present invention.
Figure 15B:
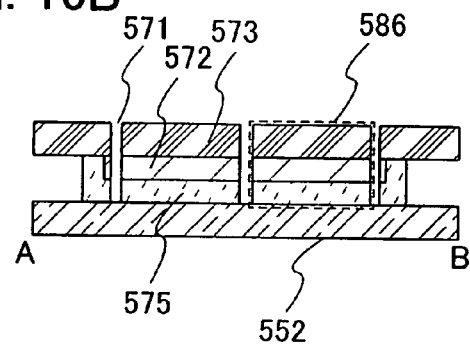

As a result, as shown in FIGS. 15A and 15B, a groove 571 is formed in the element layer and a sealing resin. The divided element layer is referred to as a thin film integrated circuit 572, and the divided sealing resin is referred to as a resin layer 575. The thin film integrated circuit 572, the resin layer 575 and the divided first flexible substrate 573 is referred to as a stacked body 586.

Figure 12B:
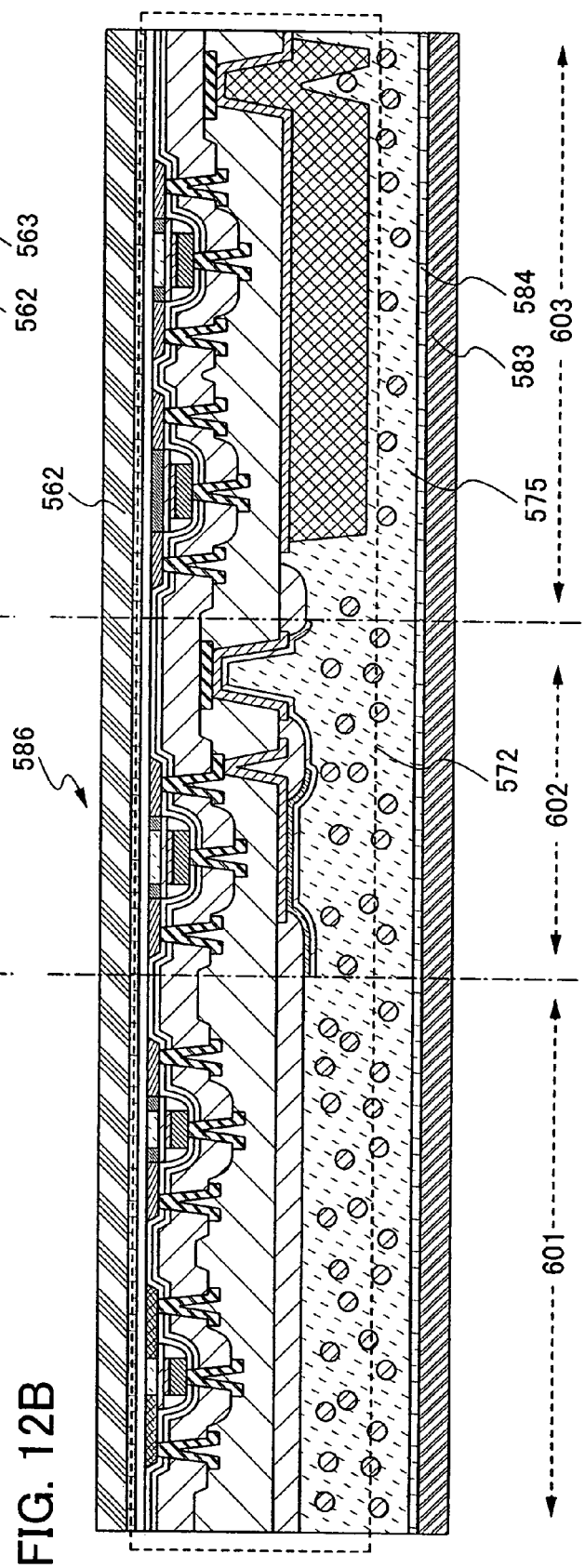

A cross sectional view of the stacked body 586 which is obtained by the steps up to here corresponds to FIG. 12B.

Figure 15C:
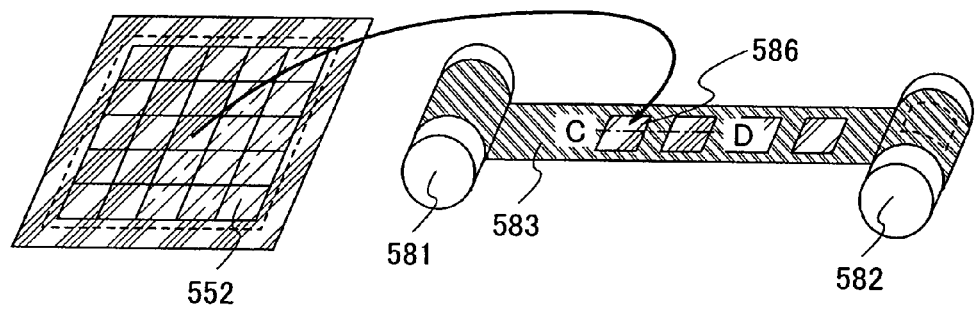
Figure 15D:
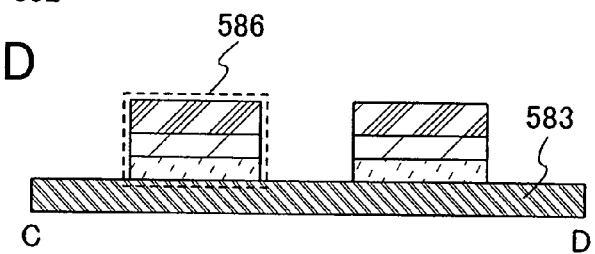

Next, as shown in FIG. 15C, the stacked body 586 provided over the supporting member 552 is picked up by a pickup device and attached to a second flexible substrate 583. Note that the second flexible substrate 583 is fed from a supply roll 581. The second flexible substrate 583 to which the stacked body 586 is attached is collected by a collection roll 582. An adhesive layer 584 (FIG. 12B) is provided over a surface of the second flexible substrate 583, and the stacked body 586 can be attached to the second flexible substrate 583 by the adhesive layer as shown in FIG. 15D which illustrates a cross sectional view taken along a line C-D of FIG. 15C.

As the second flexible substrate 583, plastic, paper, prepreg, ceramic sheet, or the like, can be used. As the adhesive layer, various curable adhesives such as a reactive curable adhesive, a thermal curable adhesive, a photo curable adhesive such as an ultraviolet curable adhesive, and an anaerobic adhesive can be used.

Further, the stacked body is provided in the process of forming paper, whereby the stacked body can be provided inside a sheet of paper.

Figure 15E:
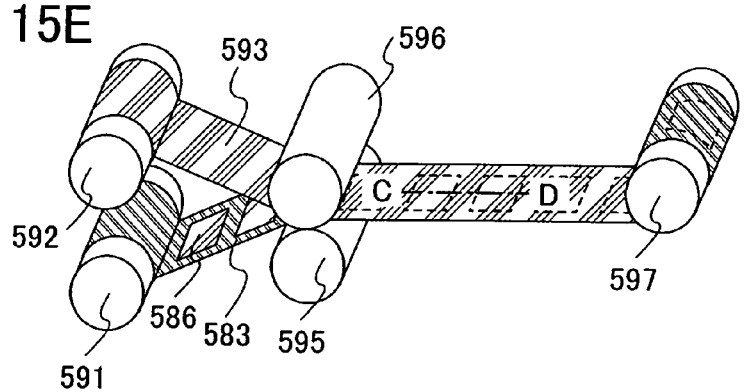

Next, as shown in FIG. 15E, a third flexible substrate 593 is attached to a surface of the second flexible substrate 583 over which the stacked body 586 is provided. Specifically, the second flexible substrate 583 over which the stacked body 586 is provided is fed from a supply roll 591. Further, the third flexible substrate 593 is fed from a supply roll 592. The second flexible substrate and the third flexible substrate are attached to each other by a pair of rollers 595 and 596, while a pressure and a rotation speed of the pair of rollers 595 and 596 are appropriately controlled. By this process, the stacked body 586 can be sealed with the second flexible substrate 583 and the third flexible substrate 593, and the second flexible substrate 583 and the third flexible substrate 593 can adhere to each other.

Figure 13:
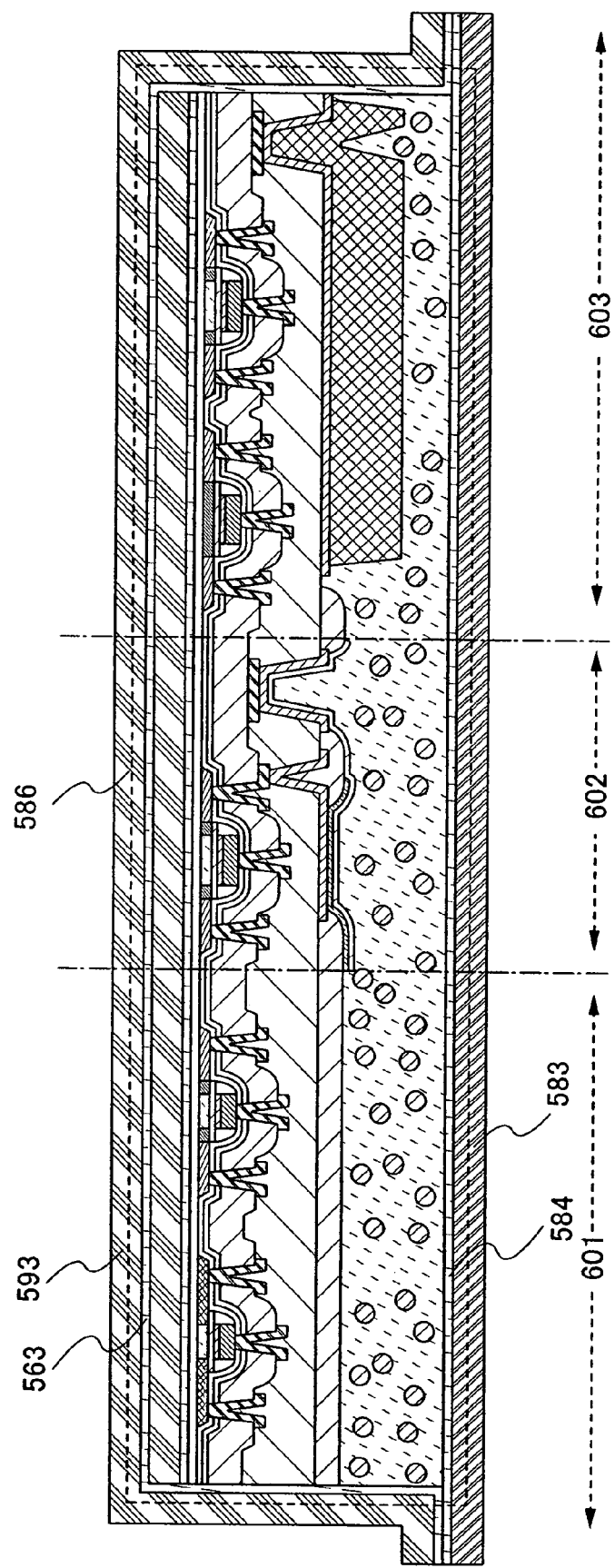
FIG. 13 is a cross sectional view illustrating a manufacturing step of a semiconductor device of the present invention.
Figure 15F:
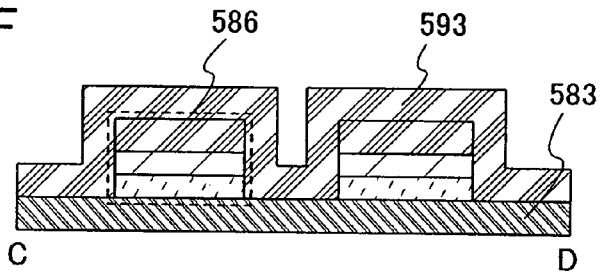

A cross sectional view of the semiconductor device obtained through the steps up to here corresponds to FIG. 13, and a cross sectional view taken along a line C-D in FIG. 15E corresponds to FIG. 15F.

After that, a region where the second flexible substrate 583 and the third flexible substrate 593 are in contact with each other is cut, whereby a flexible semiconductor device which can transmit/receive information wirelessly and has a highly reliable storage function can be manufactured.

Embodiment 2

A semiconductor device capable of transmitting and receiving data without contact of the present invention can be used by being provided in, for example, paper money, coins, securities, certificates, bearer bonds, packing containers, books, recording media, personal belongings, vehicles, food items, clothes, healthcare items, livingwares, medicals, electronic devices, and the like. Examples thereof will be described with reference to FIGS. 16A to 17C.

Figure 16A:
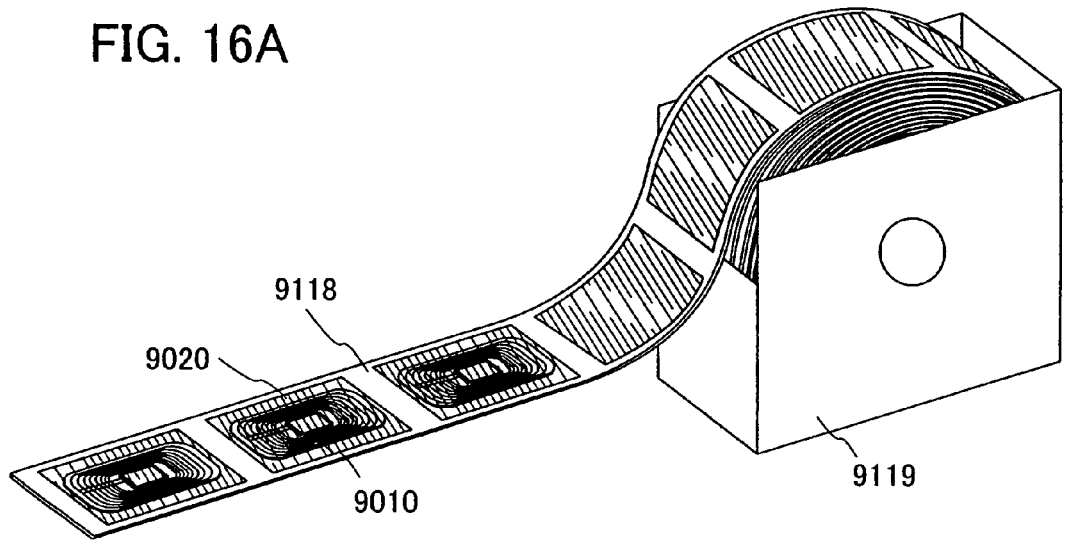
FIGS. 16A to 16E illustrate application examples of a semiconductor device of the present invention.

FIG. 16A shows an example of a state of completed products of labels with built-in semiconductor devices 9010 according to the present invention. On a label board (separate paper) 9118, labels 9020 with the built-in semiconductor devices 9010 are formed. The labels 9020 are put in a box 9119. On the label, information on a commercial product or service (for example, a name of the product, a brand, a trademark, a trademark owner, a seller, a manufacturer, and the like) is written, while an ID number that is unique to the commercial product (or the kind of the commercial product) is assigned to the semiconductor device 9010 to make it possible to easily figure out forgery, infringement of intellectual property rights such as a patent and a trademark, and illegality such as unfair competition. In addition, a lot of information that is too much to be written clearly on a container of the commercial product or the label, for example, the production area, selling area, quality, raw material, efficacy, use, quantity, shape, price, production method, directions for use, time of the production, time of the use, expiration date, instructions of the commercial product, information on the intellectual property of the commercial product, and the like can be input in the semiconductor device 9010 so that a transactor and a consumer can access the information using a simple reader. While rewriting, deleting, and the like of the information can be conducted by the producer, a transactor or consumer is not allowed to conduct rewriting, deleting, and the like of the information.

Figure 16B:
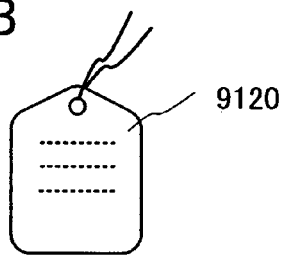

FIG. 16B illustrates a tag 9120 with a built-in semiconductor device. By mounting the tag with a built-in semiconductor device on commercial products, the management of the commercial products becomes easier. For example, in the case where the commercial product is stolen, the thief can be figured out quickly by tracing the pathway of the commercial product. In this way, by providing the tag with a built-in semiconductor device, commercial products that are excellent in so-called traceability (traceability means that preparation is made for smoothly grasping the cause of a problem, which may occur at each complicated stage of manufacture and distribution, by tracing the pathway) can be distributed.

Figure 16C:
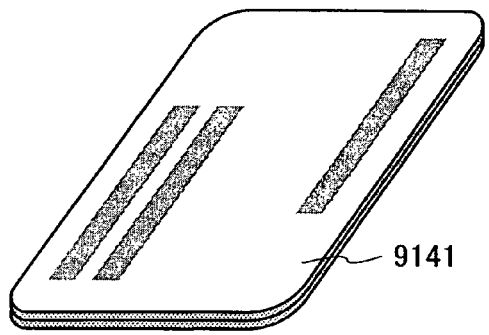

FIG. 16C illustrates an example of a state of a completed product of an ID card 9141 with a built-in semiconductor device according to the present invention. The ID card includes all kinds of cards such as a cash card, a credit card, a prepaid card, an electronic ticket, electronic money, a telephone card, and a membership card.

Figure 16D:
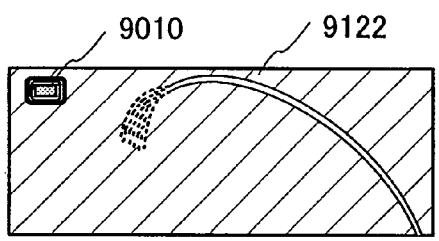

FIG. 16D shows an example of a state of a completed product of a bearer bond 9122 with a built-in semiconductor device 9010 according to the present invention. The bearer bonds include, but not limited to of course, stamps, tickets, admission tickets, merchandise coupons, book coupons, stationery coupons, beer coupons, rice coupons, various gift coupons, and various service coupons. In addition, a semiconductor device of the present invention can be provided in securities such as a check, a bill, and a promissory note, certificates such as a driving license and a resident card, or the like, not limited to the bearer bonds.

Figure 16E:
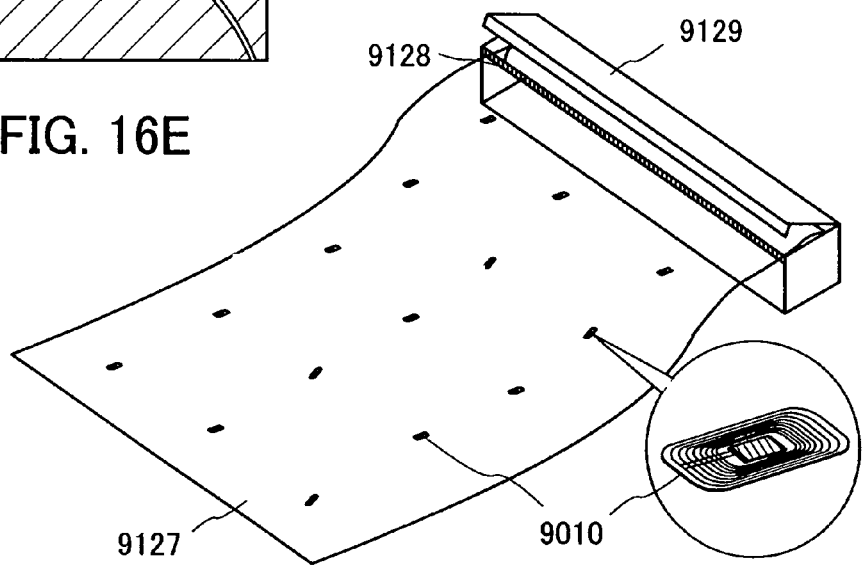

FIG. 16E illustrates a wrapping film 9127 with built-in semiconductor devices 9010, for wrapping a commercial product. The wrapping film 9127 can be manufactured, for example, by scattering semiconductor devices 9010 arbitrarily on a lower film and covering them with an upper film. The wrapping film 9127 is put in a box 9129, and the desired amount of the film can be cut away with a cutter 9128 and used. The material of the wrapping film 9127 is not particularly limited. For example, materials such as a thin film resin, an aluminum foil, and paper can be used.

Figure 17A:
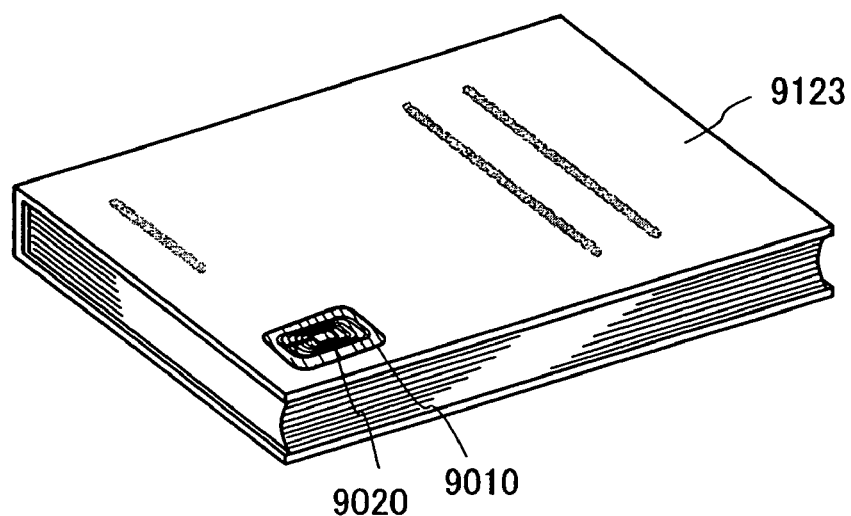
FIGS. 17A to 17C illustrate application examples of a semiconductor device of the present invention.
Figure 17B:
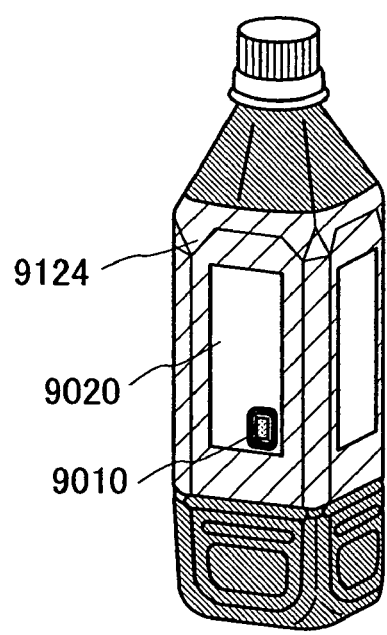

FIGS. 17A and 17B respectively illustrate a book 9123 and a plastic bottle 9124 to which a label 9020 with a built-in semiconductor device 9010 according to the present invention is attached. Note that the goods are not limited to these and the label may be attached to various goods such as packing containers such as paper for packing a box lunch; recording media such as DVD software and a video tape; vehicles including a wheeled vehicle such as a bicycle and a vessel; personal belongings such as a bag and glasses; food items such as foods and beverages; clothes such as clothing and footwear; healthcare items such as a medical device and a health appliance; livingware such as furniture and a lighting apparatus; medicals such as a medicine and an agricultural chemical; and electronic devices such as a liquid crystal display device, an EL display device, a television set (a television receiver, a thin television receiver), and a mobile phone. The semiconductor device that is used in the present invention is quite thin, therefore, when the label is mounted on goods such as the book, the function or design is not damaged. Furthermore, in the case of a semiconductor device of the present invention, an antenna and a chip can be formed in an integrated manner to make it easier to transfer the semiconductor device of the present invention directly to a commercial product with a curved surface.

Figure 17C:
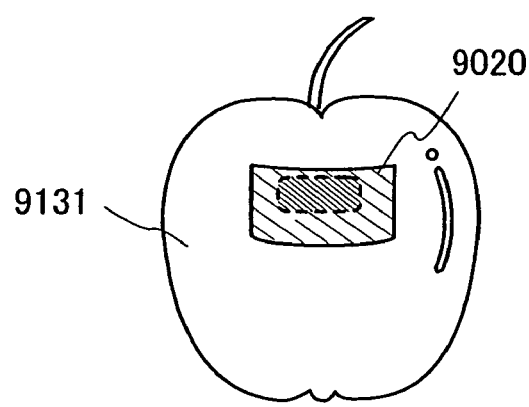

FIG. 17C illustrates a state in which the label 9020 is directly attached to fresh food such as fruits 9131. When a label is attached to a commercial product, probably, the label is peeled off. However, when the commercial product is wrapped in wrapping films, it is difficult to peel off the wrapping film, which brings some merit for security.

When a semiconductor device of the present invention is provided in paper money, coins, securities, certificates, bearer bonds, and the like, forgery of them can be prevented. When a semiconductor device of the present invention is provided in packing containers, books, recording media, personal belongings, clothes, food items, livingware, electronic devices, and the like, inspection systems, rental systems, and the like can be performed more efficiently. When a semiconductor device of the present invention is provided in vehicles, healthcare items, medicals, and the like, forgery and theft thereof can be prevented and medicines can be prevented from being taken in the wrong manner.

As described above, a semiconductor device of the present invention can be used for any product. Since a semiconductor device of the present invention is thinner and more bendable, a user can naturally use a product with the semiconductor device attached. Note that this embodiment can be freely combined with the other embodiment modes and embodiments.

Embodiment 3

In this embodiment, a peeling step of the semiconductor device manufactured by using Embodiment 1 will be explained hereinafter with reference to FIG. 9A to FIG. 13. First, a manufacturing step of the semiconductor device will be explained below.

An insulating film (not shown) was formed over the substrate 501 and the peeling layer 502 was formed over the insulating film. Here, as the substrate 501, a square glass substrate having a side of 126.6 mm (EAGLE2000 manufactured by Corning Incorporated) was used. As the insulating film, a silicon oxynitride film with a thickness of 100 nm was formed by a plasma CVD method using a silane gas and dinitrogen monoxide. As the peeling layer 502, a tungsten layer with a thickness of 30 nm was formed by sputtering a tungsten target by an argon gas.

Next, the first insulating layer 503 was formed over the peeling layer. As the first insulating layer 503, a silicon oxide layer with a thickness of 200 nm was formed by sputtering a silicon target by oxygen and argon, a silicon nitride oxide layer with a thickness of 50 nm was formed by a plasma CVD method using $SiH_4$, $NH_3$, and $N_2O$, and a silicon oxynitride layer with a thickness of 100 nm was formed by a plasma CVD method using $SiH_4$ and $N_2O$, Note that when a silicon oxide layer with a thickness of 200 nm was formed by a sputtering method, oxygen plasma treatment was performed to a surface of the tungsten layer, and a tungsten oxide layer with a thickness of several nm was formed over the surface of the tungsten layer.

Next, the semiconductor layer was formed over the first insulating layer 503. Here, an amorphous silicon layer was formed as the semiconductor layer by a plasma CVD method using a silane gas, and then hydrogen contained in the amorphous silicon layer was removed by heating at 500° C. for one hour and at 550° C. for 4 hours. After that, an oxide film over a surface of the amorphous silicon layer was removed with hydrofluoric acid, and then the amorphous silicon layer was irradiated with a continuous wave laser beam of a second harmonic (532 nm) of a Nd:$YVO_4$ laser to form a crystalline silicon layer.

Next, a very small amount of an impurity element (boron or phosphorus) was added to the crystalline silicon layer in order to control a threshold value of a thin film transistor. Here, an ion doping method was used, in which 2.5% diborane ($B_2H_6$) was excited by plasma but not separated by mass, so that the crystalline silicon layer was doped with boron at $1 \times 10^{17}/cm^3$ to $7 \times 10^7/cm^3$.

Next, a resist was applied over the crystalline silicon layer, and then light exposure was performed using a photomask and development was performed to form a resist mask. The crystalline silicon layer was selectively etched using the resist mask to form crystalline silicon layers that were separated. Here, an oxide film over a surface of the crystalline silicon layer was removed, an oxide film was formed over the surface of the crystalline silicon layer by using a solution of hydrofluoric acid and hydrogen peroxide, and then a resist was applied. The resist was exposed to light using a photomask and developed to form a resist mask. Then, with use of the resist mask, the crystalline silicon layer was dry-etched by using $SF_6$ and $O_2$, so that a crystalline silicon layer that was separated was formed. After that, the resist mask was removed.

Next, a second insulating layer which functions as a gate insulating film was formed over the crystalline silicon layer that was separated. Here, a silicon oxynitride layer with a thickness of 20 nm was formed as the second insulating layer by a plasma CVD method using $SiH_4$ and $N_2O$.

Next, a resist mask was formed using a photomask, the low-concentration impurity region 511 was formed by introduction of an impurity element (boron or phosphorus) to the crystalline, silicon layer to be the capacitor electrode of the capacitor. Here, the n-type low-concentration impurity region 511 with a phosphorus (P) concentration of $1\times10^{15}$ to $1\times10^{19}/$ cm$^3$ in the crystalline silicon layer was formed by ion doping of 5% phosphine. After that, the resist mask was removed.

Next, the gate electrodes 504 to 507 and the capacitor electrode 508 were formed over the second insulating layer. Here, sputtering was performed using tantalum nitride as a target and using argon as a sputtering gas to form a tantalum nitride layer with a thickness of 30 nm. Then, sputtering was performed using tungsten as a target and using argon as a sputtering gas to form a tungsten layer with a thickness of 370 nm. After that, a surface of the tungsten layer was coated with a resist, and the resist was exposed to light using a photomask and developed, so that resist mask was formed. Then, with the use of the resist mask, the tungsten layer and the tantalum nitride layer were dry-etched by using $Cl_2$, $SF_6$ and $O_2$ to form the gate electrodes 504 to 507 and the capacitor electrode 508. After that, the resist mask was removed.

Next, a resist mask was formed using a photomask so as to cover the semiconductor layer in a region to be a p-channel thin film transistor, and a low-concentration impurity region was formed by adding an impurity element to the semiconductor layer in the region to be a n-channel thin film transistor using the gate electrodes 505 to 507 as masks. Here, the n-type impurity region with a phosphorus (P) concentration of $1\times10^{15}$ to $1\times10^{19}$/cm$^3$ in the semiconductor layer was formed in a region to be an n-channel thin film transistor by ion doping of 5% phosphine. After this, the resist mask was removed.

Next, a resist mask was formed using a photomask so as to cover the semiconductor layer to be an n-channel thin film transistor, and p-type impurity regions 514 and 515 were formed by adding an impurity element to the semiconductor layer in a region to be a p-channel thin film transistor using the gate electrode 504 as a mask. Here, the p-type impurity regions 514 and 515 with a boron (B) concentration of $1\times10^{19}$ to $1\times10^{20}$/cm$^3$ in the semiconductor layer were formed in a region to be a p-channel thin film transistor by ion doping of 15% diborane. In addition, the channel formation region 516 was formed.

Next, sidewalls 510 were formed on both side surfaces of the gate electrodes 504 to 507 and the capacitor electrode 508. Here, a silicon oxynitride layer with a thickness of 100 nm was formed by a plasma CVD method using $SiH_4$ and $N_2O$, and then a silicon oxide layer with a thickness of 200 nm was formed by a LPCVD method. Then, a resist was applied over a silicon oxide layer, and the silicon oxide layer formed on a back surface of the substrate was etched by wet etching. After that, the resist over the silicon oxide layer was removed, and the silicon oxide layer and the silicon oxynitride layer were dry-etched using $CHF_3$ and $O_2$ to form the sidewalls 510. Note that a part of the second insulating layer was etched and removed at the same time when the sidewalls 510 were formed. A part of the second insulating layer was removed, and the residual portion of the gate insulating layer 512 was formed below the gate electrodes 504 to 507, the capacitor electrode 508, and the sidewalls 510.

Next, a resist mask was formed using a photomask so as to cover the semiconductor layer to be a p-channel thin film transistor, and a high-concentration impurity region was formed by adding an impurity element to the semiconductor layer in a region to be a n-channel thin film transistor using the gate electrodes 504 to 507, the capacitor electrode 508, and the sidewalls 510 as masks. Here, ion doping of 5% phosphine was performed, so that phosphorus was contained at a concentration of $1\times10^{19}$ to $1\times10^{20}$/cm$^3$ in the crystalline silicon layer in a region to be an n-channel thin film transistor, and thus the n-type high-concentration impurity region could be formed. Specifically, source or drain regions 513, 517 and 518, LDD regions 519 and 520, and a channel formation region 521 were formed in the semiconductor layer in a region to be an n-channel thin film transistor. The LDD regions 519 and 520 were formed below the sidewalls 510. Further, a low-concentration impurity region 511 and a high-concentration impurity region 513 were formed in the semiconductor layer to be the capacitor electrode of the capacitor.

Next, activation treatment of an impurity element added into the semiconductor layer was performed after formation of the fourth insulating layer 522 containing hydrogen. Here, a silicon oxynitride layer with a thickness of 50 nm was formed by a plasma CVD method using $SiH_4$ and $N_2O$, and then activation treatment of an impurity element was performed by heating at 550° C. for 4 hours in a nitrogen atmosphere.

Next, the fifth insulating layer 523 and the sixth insulating layer 524 were formed as a second layer and a third layer respectively of the interlayer insulating layer. Here, as the fifth insulating layer 523, a silicon nitride oxide layer with a thickness of 100 nm was formed by a plasma CVD method using $SiH_4$, $NH_3$, and $N_2O$, and then as the sixth insulating layer 524, a silicon oxynitride layer with a thickness of 600 nm was formed by a plasma CVD method using $SiH_4$ and $N_2O$.

Next, hydrogenation treatment of the crystalline silicon layer was performed. Here, heating was performed at 410° C. for one hour in a nitrogen atmosphere.

A cross sectional view of the semiconductor device obtained by the steps up to here corresponds to FIG. 9A.

Next, a resist was applied over the sixth insulating layer 524, and then the resist was exposed to light using a photomask and developed to form a resist mask. After that, the fourth insulating layer 522, the fifth insulating layer 523 and the sixth insulating layer 524 were selectively etched, and a contact hole that reaches the semiconductor layer and a contact hole that reaches the gate electrode were formed. Here, the fourth insulating layer 522, the fifth insulating layer 523 and the sixth insulating layer 524 were etched by dry etching using $CHF_3$ and $H_2$. Then, the resist mask was removed after etching.

Next, an oxide layer on the surface of the semiconductor layer which was exposed was removed by an etchant containing hydrofluoric acid, and the surface of the semiconductor layer which was exposed was cleaned at the same time.

Next, a conductive layer was formed using a sputtering method. Here, a titanium layer with a thickness of 60 nm was formed by a sputtering method using titanium as a target, and a titanium nitride layer with a thickness of 40 nm was formed by a sputtering method using titanium nitride as a target, an aluminum layer with a thickness of 500 nm was formed by a sputtering method using aluminum as a target, and a titanium layer with a thickness of 100 nm was formed using titanium as a target.

Next, after a resist was applied, the resist was exposed to light using a photomask and developed to form a resist mask. Then, the conductive layer was selectively etched to form source electrodes or drain electrodes 525 to 532, gate lead wiring 535 to 538, capacitor wirings 533, 534 and 539 of the capacitor, a lead wiring 541 of the second electrode of the memory element and a conductive layer 542. After that, the resist mask was removed.

A cross sectional view of the semiconductor device which was subjected to the steps up to here corresponds to FIG. 9B. The thin film transistor in the logic circuit portion 601, the thin film transistor in the memory portion 602, the antenna, and the thin film transistor and the capacitor in the power supply circuit portion 603 can be formed over the same substrate.

Next, the seventh insulating layer 540 was formed which covers the sixth insulating layer 524, the source electrodes or drain electrodes 525 to 532, the gate lead wiring 535 to 538, the capacitor wirings 533, 534 and 539 of the capacitor, the lead wiring 541 of the second electrode of the memory element and the conductive layer 542. Here, photosensitive polyimide was applied as the seventh insulating layer 540, and then the photosensitive polyimide was exposed to light using a photomask, developed and baked at 300° C. for one hour to form the seventh insulating layer 540 with a thickness of 1500 nm having an opening which reaches the lead wiring 541 and an opening which reaches the conductive layer 542.

Next, the first electrode layer 543 of the memory element, the conductive layer 544 to be connected to the lead wiring 541 and a base film 545 of the antenna were formed over the seventh insulating layer 540. Here, a titanium layer with a thickness of 100 nm was formed using titanium as a target, and then a resist was applied over the titanium layer. The resist was exposed to light using a photomask and developed, so that a resist mask was formed. Then with the use of the resist mask, the titanium layer was dry-etched using $BCl_3$ and $Cl_2$ to form the first electrode layer 543 of the memory element, the conductive layer 544 to be connected to the lead wiring 541 and the base film 545 of the antenna. After that, the resist mask was removed.

A cross sectional view of the semiconductor device which experienced the steps up to here corresponds to FIG. 9C.

Next, the eighth insulating layer 548 was formed so as to cover the first electrode layer 543, the conductive layer 544, the base film 545 of the antenna and the seventh insulating layer 540. Here, photosensitive polyimide was applied as the eighth insulating layer, and the photosensitive polyimide was exposed to light using a photomask and developed. Then, the photosensitive polyimide was heated at 250° C. for one hour to form the eighth insulating layer 548 with a thickness of 800 nm.

Next, the antenna 546 was formed over the base film 545. Here, an aluminum layer with a thickness of 5 μm was formed by a sputtering method using aluminum as a target. Then, a resist was applied over the aluminum layer. The resist was exposed to light using a photomask and developed. After this, the resist was baked at 150° C. for 30 minutes, and a resist residue was removed by oxygen ashing. Then, the aluminum layer was etched by using an etchant in which acetic acid, nitric acid, phosphoric acid and water were mixed to give the antenna 546.

Next, a layer 549 including an organic compound was formed over a part of the first electrode layer 543 and the eighth insulating layer 548. Here, a calcium fluoride layer with a thickness of 1 nm was formed by an evaporation method, and then a CzPA layer with a thickness of 10 nm and a calcium fluoride layer with a thickness of 1 nm were formed by an evaporation method, giving the layer 549 including an organic compound.

A cross sectional view of the semiconductor device which is fabricated by the steps up to here corresponds to FIG. 10A.

Next, the second electrode 550 of the memory element was formed over a part of the layer 549 including an organic compound, the conductive layer 544 and the eighth insulating layer 548. The second electrode 550 was also connected to the conductive layer 544. Here, the second electrode 550 was formed as an alloy of tin and silver with a thickness of 200 nm.

A cross sectional view of the semiconductor device obtained through the steps up to here corresponds to FIG. 10B. In this embodiment, the thin film transistor in the logic circuit portion 601, the thin film transistor and the memory element 600 in the memory portion 602, the antenna, and the thin film transistor in the power supply circuit portion 603 can be formed over the same substrate.

Next, the ninth insulating layer 551 including moisture absorbing materials 555 was formed so as to cover the eighth insulating layer 548, the second electrode 550 and the antenna 546. As the ninth insulating layer 551, a sealing layer which has a function of preventing water or the like contained in an outside air from entering the element layer 554 was formed. Here, an epoxy resin including a fine particle of calcium oxide, which functions as the moisture absorbing material 555, having an average grain diameter of 40 μm (Hicap2000 manufactured by Nippon Chemical Industrial Co., LTD.) was printed by a printing method and baked at 160° C. for 30 minutes, which resulted in the formation of the ninth insulating layer 551 with a thickness 10 to 30 μm. Note that a stacked body from the first insulating layer to the second electrode is referred to as an element layer 554. The ninth insulating layer 551 also functions as a sealing layer which seals the element layer 554.

Next, in order to perform the later peeling step easily, the peeling layer was irradiated with a laser beam to form a groove.

Next, the supporting member 552 was provided over the ninth insulating layer 551. Here, as the supporting member 552, a thermal separating film was attached to the ninth insulating layer 551.

A cross sectional view of the semiconductor device obtained by the steps up to here corresponds to FIG. 11A.

Next, the element layer and the sealing layer were peeled off the substrate 501. Specifically, the element layer 554 and the insulating layer 551 were peeled off the substrate 501 at the peeling layer 502 by the physical method. Here, a roller 561 having adhesiveness was held to a surface of the supporting member 552 and the roller 561 was rotated, whereby the element layer 554 and the insulating layer 551 were peeled off the substrate 501.

A cross sectional view of the semiconductor device in which the steps up to here were conducted corresponds to FIG. 11B.

Next, the first flexible substrate 562 was attached to the element layer 554 and the insulating layer 551 which were peeled off the peeling layer. Here, a laminate film having a thermoplastic adhesive layer was provided as the first flexible substrate over a surface of the element layer 554 and the insulating layer 551, and the laminate film was pressed by the roller which was heated to 135° C. and attached to the surface of the element layer 554 and the insulating layer 551.

A cross sectional view of the semiconductor device which was obtained by the steps up to here corresponds to FIG. 12A. After that, the supporting member 552 was heated and peeled off the ninth insulating layer 551.

Next, the second flexible substrate 583 was attached to the insulating layer 551. Here, a laminate film having a thermoplastic adhesive layer was provided as the second flexible substrate over a surface of the insulating layer 551, and the laminate film was pressed by the roller which was heated to 135° C. and firmly attached to the surface of the insulating layer 551.

After that, a portion in which the first flexible substrate, the element layer and the second flexible substrate 583 were overlapped was selectively irradiated with an ultraviolet (UV) laser beam and divided, whereby the semiconductor device were manufactured.

The yield of peeling process is described below. Here, 50 semiconductor devices were provided over one substrate. 74 to 78% of the semiconductor devices over one substrate were successfully peeled. It can be found that even when a sealing layer containing a moisture absorbing material was used as a protection layer of the element layer, peeling was normally performed.

This application is based on Japanese Patent Application serial no. 2006-320482 filed in Japan Patent Office on Nov. 28, in 2006, the entire contents of which are hereby incorporated by reference.

What is claimed is:

1. A memory device comprising:
a memory element formed over a first substrate, the memory element comprising
a first electrode;
a second electrode; and
a layer containing an organic compound, the layer containing the organic compound being interposed between the first electrode and the second electrode,
a sealing layer formed over the second electrode, the sealing layer containing a moisture absorbing material, and
a flexible substrate formed over the sealing layer containing the moisture absorbing material.

2. A memory device according to claim 1,
wherein the first substrate is flexible.

3. A memory device according to claim 1,
wherein the memory element is arranged to undergo a short circuit when a voltage is applied between the first electrode and the second electrode.

4. A memory device according to claim 1, further comprising an antenna,
wherein the antenna is arranged to receive and transmit data and instruction with radio signals.

5. A memory device according to claim 1,
wherein a thickness of the layer containing the organic compound is in the range from 5 nm to 30 nm.

6. A memory device according to claim 1,
wherein a grain size of the moisture absorbing material is greater than or equal to 1 µm and less than or equal to 100 µm.

7. A memory device according to claim 1,
wherein the moisture absorbing material is a particle formed of molten silica, crystalline silica, alumina, silicon nitride, aluminum nitride, boron nitride, zeolite, an oxide of an alkaline earth metal, sulfate or a high water-absorbing polymer.

8. A memory device comprising:
a thin film transistor formed over a first substrate,
a memory element electrically connected to the thin film transistor, the memory element comprising
a first electrode;
a second electrode; and
a layer containing an organic compound, the layer containing the organic compound being interposed between the first electrode and the second electrode,
a sealing layer formed over the second electrode, the sealing layer containing a moisture absorbing material, and
a flexible substrate formed over the sealing layer containing the moisture absorbing material.

9. A memory device according to claim 8,
wherein the first substrate is flexible.

10. A memory device according to claim 8,
wherein the memory element is arranged to undergo a short circuit when a voltage is applied between the first electrode and the second electrode.

11. A memory device according to claim 8, further comprising an antenna,
wherein the antenna is electrically connected to the thin film transistor.

12. A memory device according to claim 8,
wherein a thickness of the layer containing the organic compound is in the range from 5 nm to 30 nm.

13. A memory device according to claim 8,
wherein a grain size of the moisture absorbing material is greater than or equal to 1 µm and less than or equal to 100 µm.

14. A memory device according to claim 8,
wherein the moisture absorbing material is a particle formed of molten silica, crystalline silica, alumina, silicon nitride, aluminum nitride, boron nitride, zeolite, an oxide of an alkaline earth metal, sulfate or a high water-absorbing polymer.

15. A memory device comprising:
a memory element formed over a first substrate, the memory element comprising
a first electrode;
a second electrode; and
a layer containing a buffer layer and a layer containing an organic compound, the layer containing the buffer layer and the layer containing the organic compound being interposed between the first electrode and the second electrode,
a sealing layer formed over the second electrode, the sealing layer containing a moisture absorbing material, and
a flexible substrate formed over the sealing layer containing the moisture absorbing material.

16. A memory device according to claim 15,
wherein the first substrate is flexible.

17. A memory device according to claim 15,
wherein the memory element is arranged to undergo a short circuit when a voltage is applied between the first electrode and the second electrode.

18. A memory device according to claim 15, further comprising an antenna,
wherein the antenna is arranged to receive and transmit data and instruction with radio signals.

19. A memory device according to claim 15,
wherein a thickness of the layer containing the organic compound is in the range from 5 nm to 30 nm.

20. A memory device according to claim 15,
wherein a grain size of the moisture absorbing material is greater than or equal to 1 µm and less than or equal to 100 µm.

21. A memory device according to claim 15,
wherein the moisture absorbing material is a particle formed of molten silica, crystalline silica, alumina, silicon nitride, aluminum nitride, boron nitride, zeolite, an oxide of an alkaline earth metal, sulfate or a high water-absorbing polymer.

22. A memory device according to claim 15,
wherein the buffer layer comprises a material selected from a metal oxide, a metal halide, a metal carbonate, a metal sulfide, or a metal nitrate.

23. A manufacturing method for a memory device comprising a memory element, the manufacturing method comprising the step of:
forming a peeling layer over a first substrate,
forming a first electrode over the peeling layer, forming a layer containing an organic compound over the first electrode, forming a second electrode over the layer containing the organic compound, forming a sealing layer over the second electrode, wherein the sealing layer contains a moisture absorbing material, and peeling off the layer containing the first electrode, the layer containing the organic compound, the second electrode, and the sealing layer from the first substrate.

24. A manufacturing method for a memory device according to claim 23, further comprising the step of forming a second substrate and the third substrate so that the layer containing first electrode, the layer containing the organic compound, the second electrode, and the sealing layer is interposed between the second substrate and the third substrate, wherein the second substrate and the third substrate are flexible.

25. A manufacturing method for a memory device comprising a memory element, the manufacturing method comprising the step of:

forming a peeling layer over a first substrate, forming a first electrode over the peeling layer, forming a layer containing an organic compound over the first electrode, forming a second electrode over the layer containing the organic compound, forming a sealing layer over the second electrode, wherein the sealing layer contains a moisture absorbing material, peeling off the layer containing the first electrode, the layer containing the organic compound, the second electrode, and the sealing layer from the first substrate, forming a second flexible substrate so that the layer containing the first electrode, the layer containing the organic compound, and the second electrode is interposed between the second substrate and the sealing layer, providing the layer containing the second flexible substrate, the first electrode, the layer containing the organic compound, the second electrode, and the sealing layer onto a third flexible substrate, wherein the third flexible substrate is arranged to be fed from a first supply roll and be collected by a collection roll, and forming a fourth flexible substrate so that the layer containing the second substrate, the first electrode, the layer containing the organic compound, the second electrode, and the sealing layer is interposed between the third flexible substrate and the fourth flexible substrate, wherein the fourth flexible substrate is arranged to be fed from a second supply roll and be collected by the collection roll.

* * * * *